United States Patent
Thiagarajan et al.

(10) Patent No.: US 9,634,667 B2
(45) Date of Patent: Apr. 25, 2017

(54) INTEGRATED CIRCUIT DEVICE WITH PROGRAMMABLE ANALOG SUBSYSTEM

(71) Applicant: Cypress Semiconductor Corporation, San Jose, CA (US)

(72) Inventors: Eashwar Thiagarajan, Bellevue, WA (US); Harold M. Kutz, Edmonds, WA (US); Hans Klein, Pleasanton, CA (US); Jaskarn Singh Johal, Mukilteo, WA (US); Jean-Paul Vanitegem, San Jose, CA (US); Kendall V. Castor-Perry, Seattle, WA (US); Mark E. Hastings, Mukilteo, WA (US); Amsby D. Richardson, Jr., Lynnwood, WA (US); Anasuya Pai Maroor, Woodinville, WA (US); Ata Khan, Saratoga, CA (US); Dennis R. Seguine, Temecula, CA (US); Bruce E. Byrkett, Preston, WA (US); Carl Ferdinand Liepold, San Jose, CA (US); Hans Van Antwerpen, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/668,984

(22) Filed: Mar. 26, 2015

(65) Prior Publication Data

US 2016/0065216 A1    Mar. 3, 2016

Related U.S. Application Data

(60) Provisional application No. 62/043,924, filed on Aug. 29, 2014.

(51) Int. Cl.
*H03K 19/177* (2006.01)
*H03K 19/0175* (2006.01)
(Continued)

(52) U.S. Cl.
CPC . *H03K 19/017581* (2013.01); *H03K 19/0005* (2013.01); *H03K 19/00346* (2013.01);
(Continued)

(58) Field of Classification Search
CPC ....... H03K 19/17724; H03K 19/17728; H03K 19/17736; H03K 19/17752; H03K 19/17756; H03M 1/004; H03M 1/005
See application file for complete search history.

(56) References Cited

U.S. PATENT DOCUMENTS 5,196,740 A    3/1993  Austin
5,338,970 A    8/1994  Boyle et al.
(Continued)

OTHER PUBLICATIONS

Anderson et al., Low-Power Programmable FPGA Routing Circuitry, VLSI Systems, IEEE Transactions, May 29, 2009, 1048-1060, vol. 17, Issue 8, IEEE Publisher.
(Continued)

*Primary Examiner* — Jason M Crawford
*Assistant Examiner* — Kurtis R Bahr

(57) ABSTRACT

An integrated circuit (IC) device can include a plurality of analog blocks, including at least one fixed function analog circuit, and at least one reconfigurable analog circuit block selected from: a continuous time (CT) block comprising a plurality of reconfigurable amplifier circuits and a discrete time block comprising amplifiers with a reconfigurable switch network; an analog multiplexer (MUX) configured to selectively connect any of a plurality of input/outputs (I/Os) of the IC device to the analog blocks, the analog MUX including at least one low noise signal path pair having a lower resistance than other signal paths of the analog MUX; at least one analog routing block reconfigurable to provide signal paths between any of the analog blocks; a digital section comprising digital circuits; and a processor interface coupled to the analog blocks.

25 Claims, 15 Drawing Sheets

(51) Int. Cl.
- *H03K 19/02* (2006.01)
- *H03K 19/00* (2006.01)
- *H03K 19/003* (2006.01)
- *H03M 1/12* (2006.01)
- *H03M 1/38* (2006.01)

(52) U.S. Cl.
CPC .......... *H03K 19/02* (2013.01); *H03M 1/1205* (2013.01); *H03M 1/38* (2013.01)

(56) References Cited

U.S. PATENT DOCUMENTS

| | | | |
|---|---|---|---|
| 6,122,697 A * | 9/2000 | Potts | G06F 12/0646 710/100 |
| 6,130,552 A | 10/2000 | Jefferson et al. | |
| 6,636,124 B1 | 10/2003 | Liu | |
| 6,806,771 B1 | 10/2004 | Hildebrant et al. | |
| 7,479,913 B1 * | 1/2009 | Thiagarajan | H03M 1/005 341/155 |
| 7,515,076 B1 | 4/2009 | Singh et al. | |
| 8,111,097 B1 * | 2/2012 | Kutz | H03K 25/04 330/260 |
| 8,143,934 B1 * | 3/2012 | Shutt | H03K 17/063 327/404 |
| 8,176,296 B2 * | 5/2012 | Snyder | G06F 1/08 712/15 |
| 8,299,850 B1 | 10/2012 | Kutz et al. | |
| 8,416,113 B1 * | 4/2013 | Vanitegem | H03M 1/004 341/155 |
| 8,487,655 B1 * | 7/2013 | Kutz | H03K 19/173 326/82 |
| 8,547,135 B1 | 10/2013 | Yarlagadda et al. | |
| 8,659,317 B1 | 2/2014 | Mohammed et al. | |
| 8,717,070 B1 * | 5/2014 | Klein | H03F 3/45475 327/108 |
| 8,816,890 B1 * | 8/2014 | Vanitegem | H03M 1/004 341/144 |
| 2004/0260858 A1 | 12/2004 | Primrose | |
| 2007/0183549 A1 * | 8/2007 | Angello | H04L 25/38 375/370 |
| 2007/0226795 A1 * | 9/2007 | Conti | G06F 21/74 726/22 |
| 2008/0288755 A1 | 11/2008 | Synder et al. | |
| 2009/0153152 A1 | 6/2009 | Maharyta et al. | |
| 2010/0244894 A1 | 9/2010 | Beal et al. | |
| 2010/0281145 A1 | 11/2010 | Sullam et al. | |
| 2011/0026519 A1 | 2/2011 | Sullam et al. | |
| 2011/0055439 A1 * | 3/2011 | Chen | G06F 13/4027 710/57 |
| 2011/0283057 A1 | 11/2011 | Snyder | |
| 2012/0086471 A1 | 4/2012 | Snyder et al. | |
| 2012/0286800 A1 | 11/2012 | Maharyta et al. | |
| 2012/0293345 A1 | 11/2012 | Zhan et al. | |
| 2013/0278312 A1 | 10/2013 | Getzin et al. | |
| 2014/0185862 A1 | 7/2014 | Kamath | |

OTHER PUBLICATIONS

Cypress Semiconductor Corporation, Datasheet: Programmable System-on-Chip (PSoC) PSoC 5LP: CY8C58LP Family, Dec. 2012.
Mentor Graphics, Low-Power Physical Design with Olympus-SoC, Mar. 27, 2009.
Wolinski et al., Optimization of Routing and Reconfiguration Overhead in Programmable Processor Array Architectures, 16th International Symposium on FCCM 2008, Apr. 14-15, 2008, 306-309, IEEE Publisher.
U.S. Appl. No. 14/670,295: "Integrated Circuit Device With Programmable Analog Subsystem," Eashwar Thiagarajan et al., filed Mar. 26, 2015; 41 pages.
Christophe Wolinski, "Optimization of Routing and Reconfiguration Overhead in Programmable Processor Array Architectures", IEEE Filed-Programmable Custom Computing Machines, 2008, pp. 306-309; 4 pages.
Cypress Semiconductor Corporation, Datasheet: Programmable System-on-Chip (PSoC) PSoC 3: CY8C38 Family, Sep. 2012.
International Search Report for International Application No. PCT/2015/061654 dated Feb. 5, 2016; 2 pages.
Jason H. Anderson, "Low-Power Programmable FPGA Routing Circuitry", IEEE Transactions on Very Large Scale Integration (VLSI) Systems, vol. 17, Issue 8, 2009, pp. 1048-1060; 13 pages.
Mentor Graphics, "Low-Power Physical Design with Olympus-SoC", IEEExplore, Mar. 27, 2009, pp. 1-14; 14 pages.
USPTO Advisory Action for U.S. Appl. No. 14/670,295 dated Jan. 11, 2016; 2 pages.
USPTO Final Rejection for U.S. Appl. No. 14/670,295 dated Oct. 9, 2015; 10 pages.
USPTO Non-Final Rejection for U.S. Appl. No. 14/670,295 dated May 21, 2015; 11 pages.
USPTO Non-Final Rejection for U.S. Appl. No. 14/670,295 dated Feb. 17, 2016; 11 pages.
Written Opinion of the International Searching Authority for International Application No. PCT/US2015/061654 dated Feb. 5, 2016; 6 pages.
International Search Report for International Application No. PCT/US15/45935 dated Nov. 6, 2015; 2 pages.

* cited by examiner

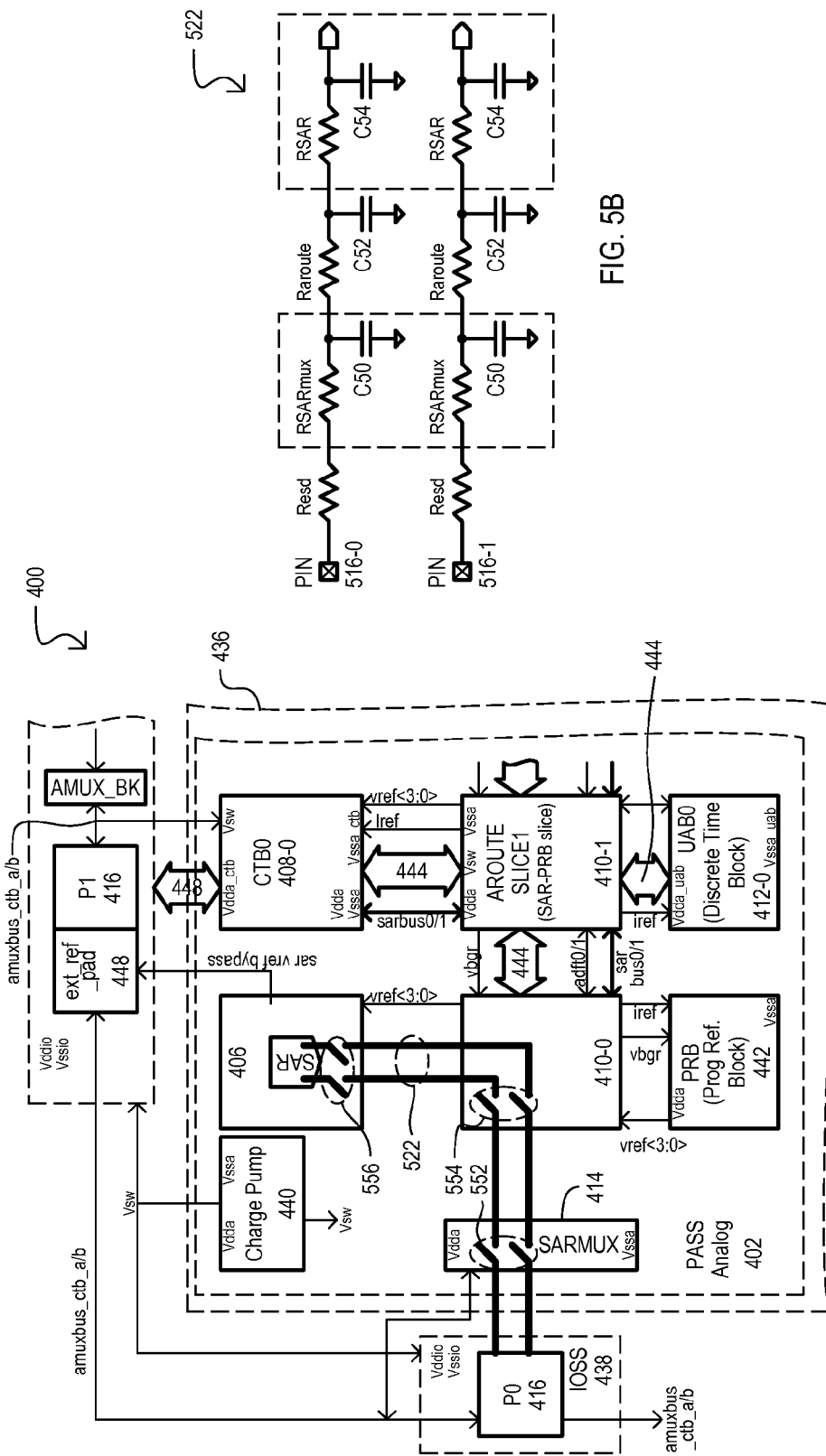
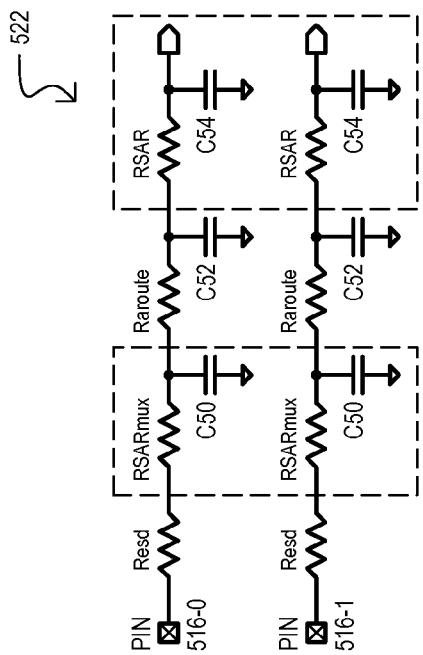
FIG. 5A
FIG. 5B

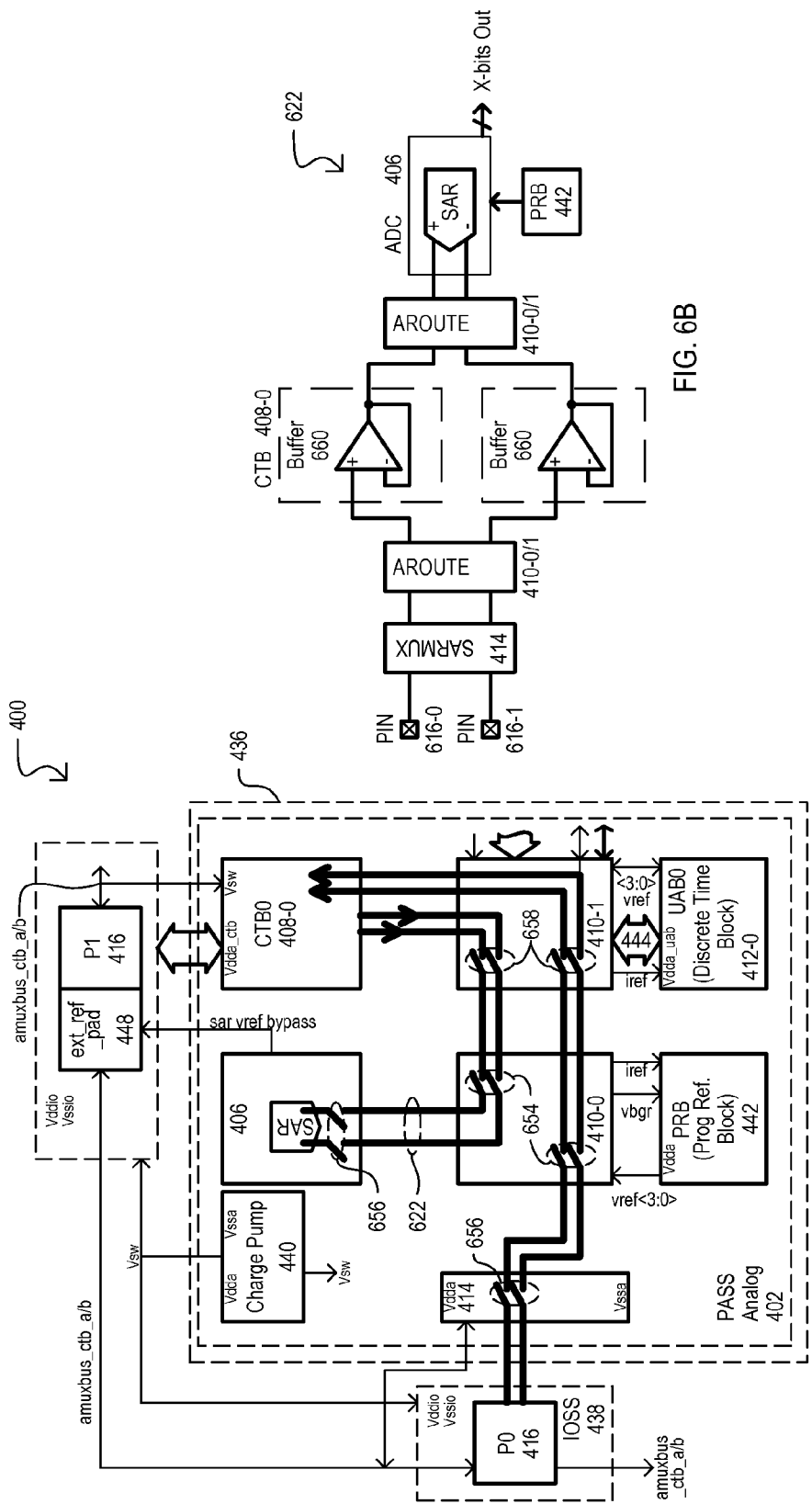

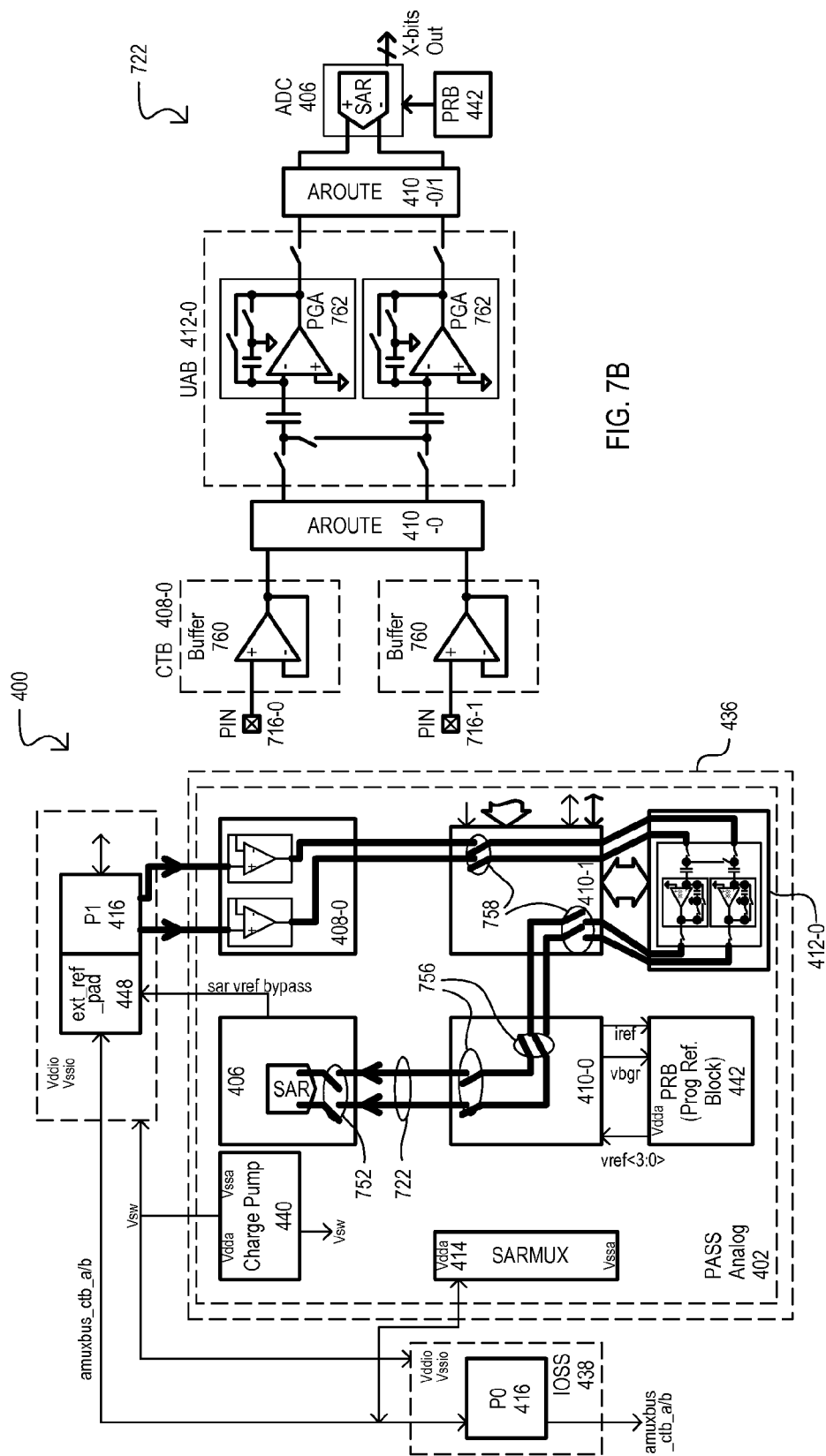

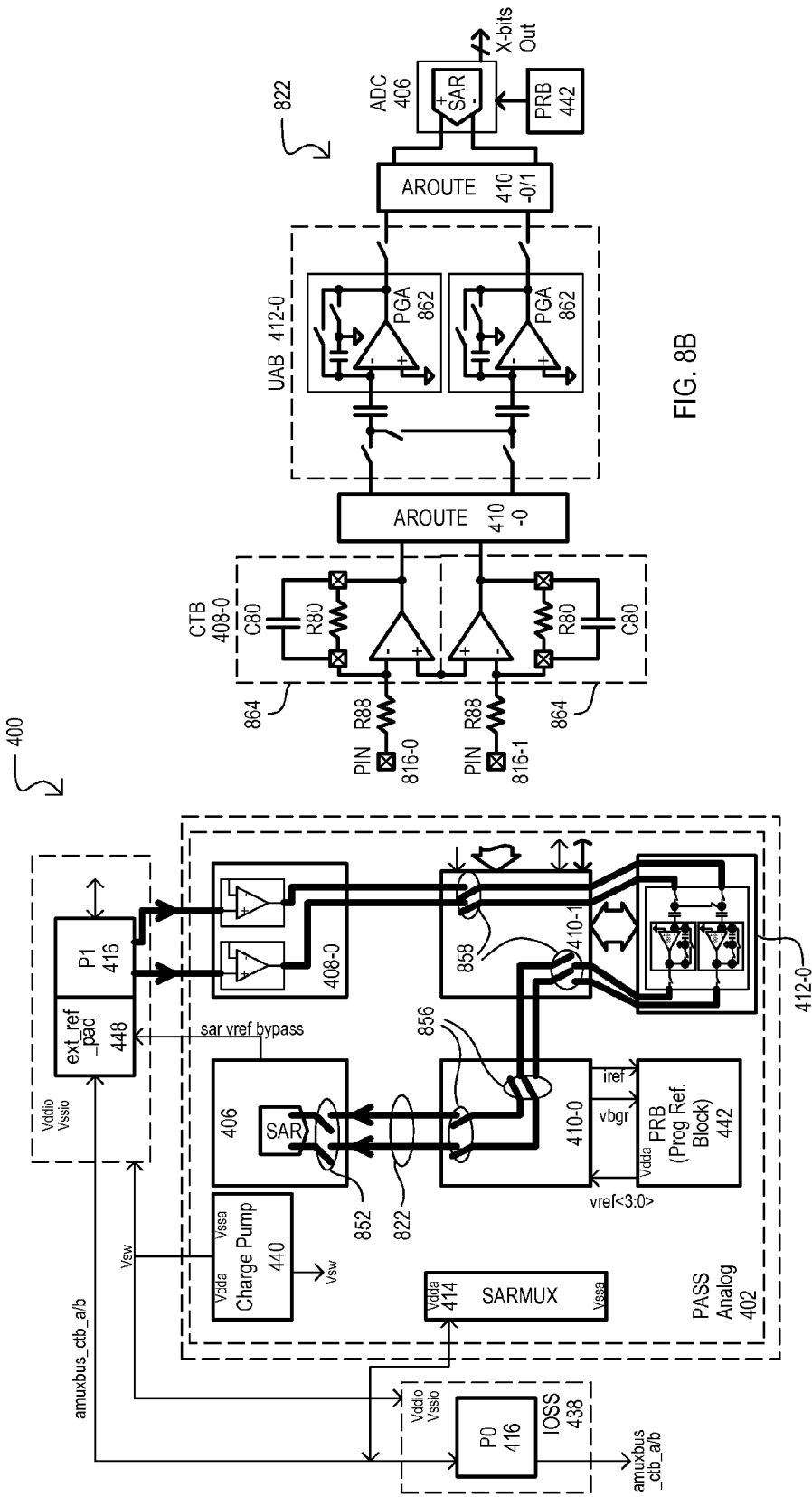

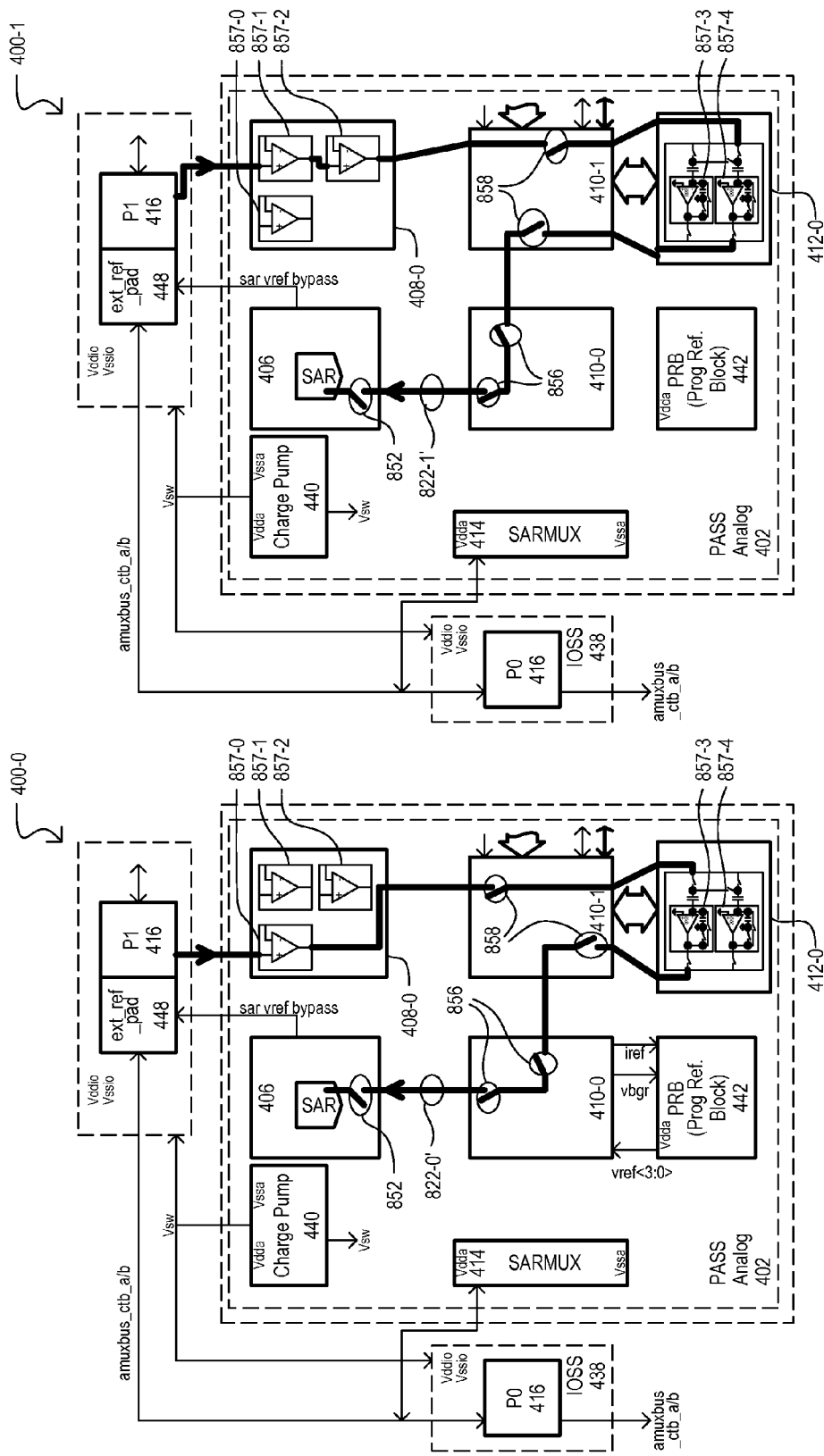

| Path ID | Signal Path Name | |
|---|---|---|
| PASS.0 | Un-buffered SAR Signal Path A | I/O (416) Connected to the SAR ADC (406) via SAR MUX (414) |
| PASS.1 | Buffered SAR Signal Path A | I/O Connected to CT block (CTB 408), configured as unity gain buffer (UGB) and driving the SAR ADC via low resistance/noise (sarbus0/1) |
| PASS.2 | Buffered SAR Signal Path B | I/O Connected to SAR MUX and inputs reach CTB configured as UGB (via analog routing block 410, AROUTE) and to the SAR ADC via AROUTE |
| PASS.3 | Buffered SAR Signal Path C | I/O Connected to SAR MUX and inputs reach CTB configured as PGA with 16x gain via AROUTE and to the SAR ADC via AROUTE |
| PASS.4 | CTB Driving UAB into SAR Path A | A 0.5 V amplitude sine wave (10 kHz) around Vdd/2 into a CTB configured as a UGB driving UAB configured as PGA (gain of 2). UAB drives the SAR ADC via AROUTE and settles into 12-bit SAR ADC conversion |
| PASS.5 | CTB Driving UAB into SAR Path B | a 70 dB SNR Channel that can be achieved when a 128 mV amplitude input signal (frequency = 10 kHz) through a differential CTB amplifier in low pass configuration |
| PASS.6 | CTB Driving UAB into SAR Path C | CTB UGB driving into UAB as down mixer and settling into SAR ADC |
| PASS.7 | CTB Driving UAB into SAR Path D | CTB UGB driving differentially into UAB configured as anti-alias filter for the SAR ADC |
| PASS.8 | UAB into CTB Path A | UAB as nth order filter into CTB to I/O |
| PASS.9 | UAB into CTB Path B | UAB as VDAC into CTB to I/O, single-ended |
| PASS.10 | UAB into CTB Path C | UAB as VDAC into CTB comparator |
| PASS.11 | SAR Multiplexing | Ability to achieve 4:1 multiplexing at the input of the SAR ADC at 250 ksps, 12-bit resolution |
| PASS.12 | CTB Multiplexing | Multiplexing of up to 4 switches dynamically in front of CTB comparator at speeds up to 1MHz |
| PASS.13 | CTB into UAB-Delsig Path A | CTB UGB driving into UAB as $1^{st}$ order sigma-delta, differential |
| PASS.14 | CTB into UAB-Delsig Path B | CTB UGB driving into UAB as $2^{nd}$ order sigma-delta, differential |
| PASS.15 | UAB Differential DAC into $1^{st}$ Order Differential UAB-Delsig Path | UAB as 6-bit DAC with into neighboring UAB as $1^{st}$ order delta signal operating at 10-bit |
| PASS.16 | CTB Driving UAB into SAR Path E | 0.5 V amplitude sine wave (10 kHz) around Vdd/2 into CTB configured as UGB driving into UAB (as 12-bit DAC). UAB drives SAR ADC via AROUTE1 and settles into 12-bit resolution |
| PASS.17 | Aroute Slice0 | Design for test path for on-resistance measurement and screening defects |
| PASS.18 | IO to CTB Driving UAB into CTB to IO | A 2V amplitude sign wave (10 kHz) around Vdd/2 into CTB UGB driving UAB filter, output of filter to I/O is buffered by CTB UGB |
| PASS.19 | DSAB DFT Trim Path | Varying current steps routed to CTB which can be measured by SAR ADC or CTB amplifier measured by tester. |
| PASS.20 | DSAB Functionality | In SLEEP mode CTB can be operated at low BW (100 kHz) or a comparator. Amplifier bias circuit (DSAB) can provide bias to amplifiers. Other circuits in PASS can be turned off. while configuration maintained. |

FIG. 15

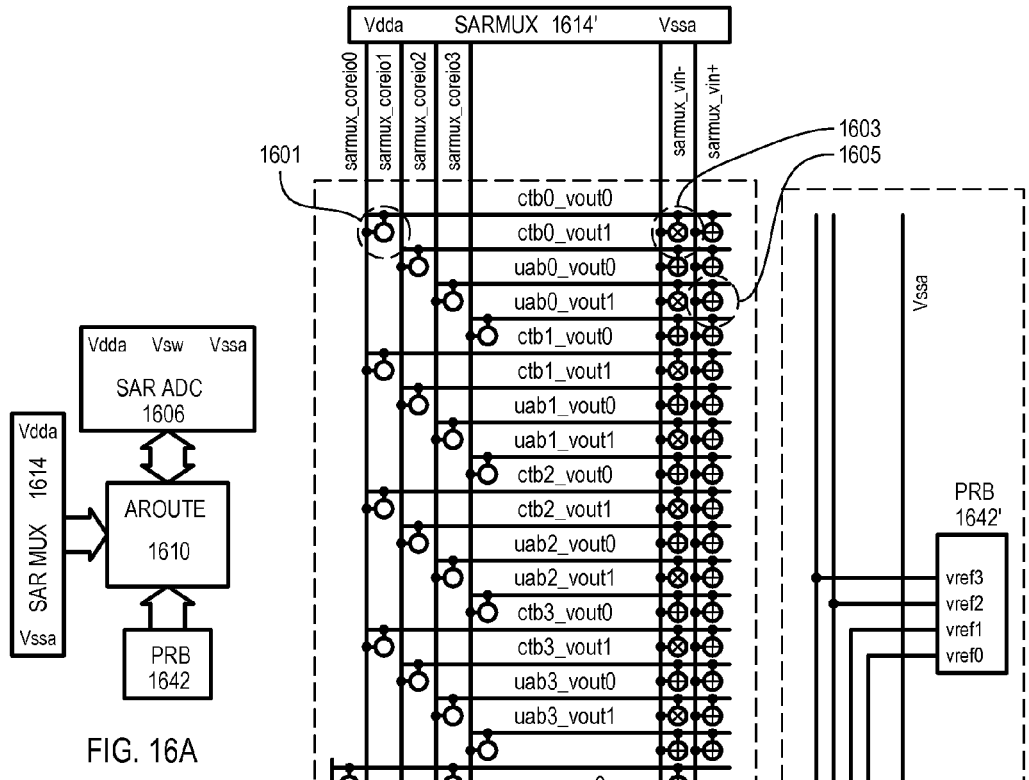
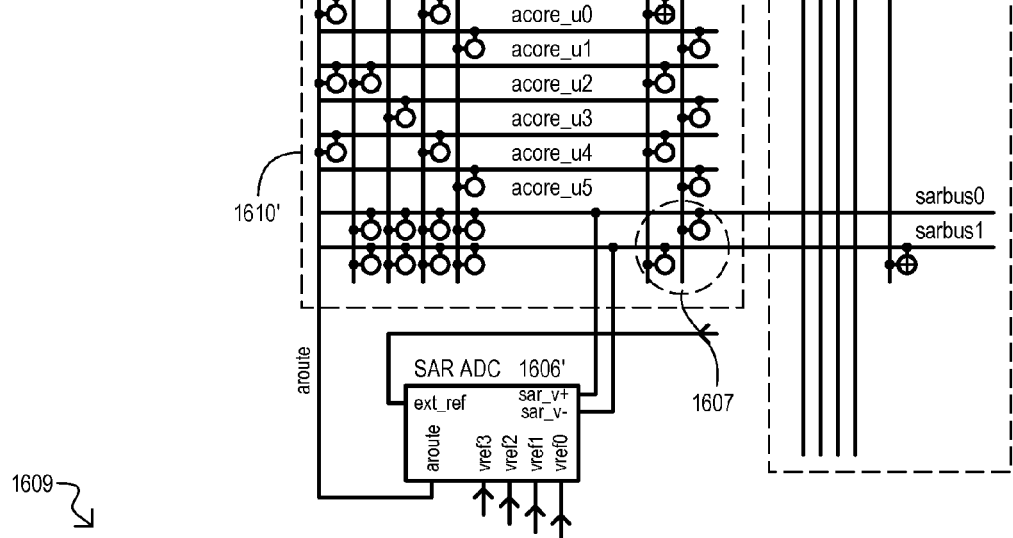
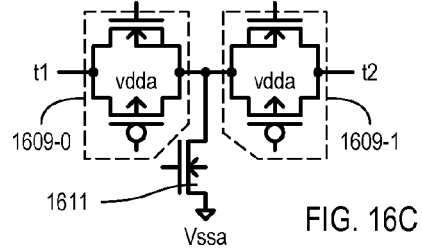
FIG. 16A
FIG. 16B
FIG. 16C

INTEGRATED CIRCUIT DEVICE WITH PROGRAMMABLE ANALOG SUBSYSTEM

CROSS-REFERENCE TO RELATED APPLICATIONS

This application claims the benefit of U.S. Provisional Patent Application Ser. No. 62/043,924 filed on Aug. 29, 2014, the contents of which are incorporated by reference herein.

TECHNICAL FIELD

The present disclosure relates generally to integrated circuit (IC) devices having programmable blocks, and more particularly to IC devices having programmable analog circuit blocks.

BACKGROUND

Integrated circuit (IC) devices can include both fixed function circuits and reconfigurable circuits. Programmable logic devices are well known and can enable an IC device to be reconfigured into a wide range of digital functions.

IC devices providing reconfigurable analog circuits are enjoying increased popularity in addressing analog applications. In some conventional approaches, configuration data for reprogrammable analog circuits is loaded into storage circuits (e.g., registers) to establish a desired analog function. A drawback to such arrangements can be to time/effort involved in reconfiguring circuits between different functions.

Conventionally, the connections/routings involved in enabling reconfigurable analog circuits can introduce limits to the performance of the IC device. For example, some conventional IC devices may not be suitable for very low noise applications. Similarly, very small impedance mismatches in routing paths prevent high fidelity processing of differential input signals.

As with most IC devices, any reduction in power consumption can be of great value, particular when the IC devices are deployed in portable electronic devices.

BRIEF DESCRIPTION OF THE DRAWINGS

FIGS. 5A and 5B are diagrams showing one possible configuration for an IC device like that of FIG. 4.

FIGS. 6A and 6B are diagrams showing another possible configuration for an IC device like that of FIG. 4.

FIGS. 7A and 7B are diagrams showing another possible configuration for an IC device like that of FIG. 4.

FIGS. 8A and 8B are diagrams showing another possible configuration for an IC device like that of FIG. 4.

FIGS. 8C and 8D are diagrams showing different configurations for a same IC device like that of FIG. 4.

FIG. 15 is a table showing various signal paths that can be implemented in an IC device like that of FIG. 4.

FIGS. 16A to 16C are diagrams showing an analog routing block that can be included in embodiments.

DETAILED DESCRIPTION

Various embodiments will now be described that show integrated circuit (IC) devices that can incorporate fixed analog circuit blocks, reconfigurable analog circuit blocks and reconfigurable digital circuit blocks with an analog routing fabric that enables diverse signal routing between all circuit blocks. The various reconfigurable circuit blocks can be configured from a variety of sources, including logic on the IC device itself, as well as signals received over a processor interface. Configuration of such circuits can be static or dynamic.

Figure 1:
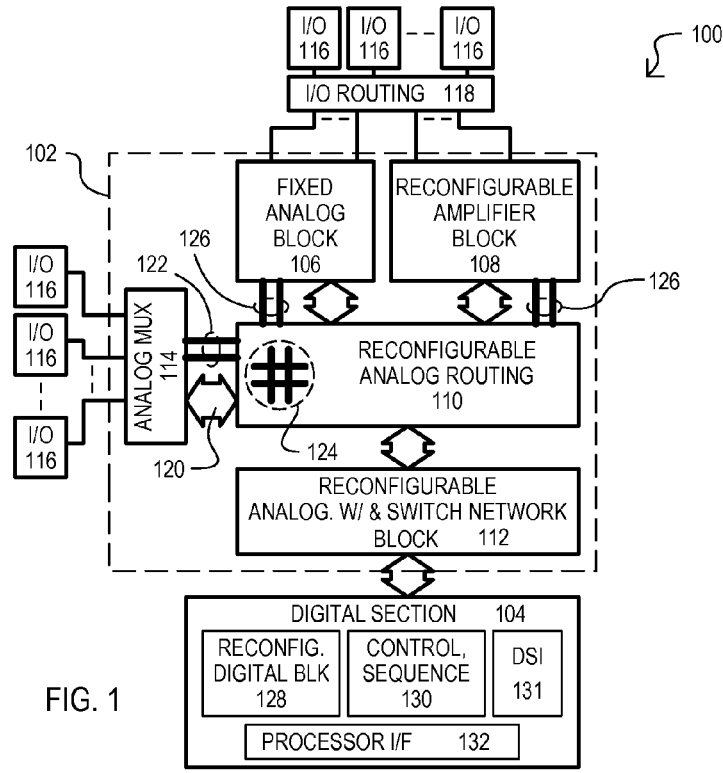
FIG. 1 is a block schematic diagram of an integrated circuit (IC) device according to an embodiment.

FIG. 1 is a block schematic diagram of an IC device 100 according to an embodiment. An IC device 100 can include low resistance reconfigurable signal paths to one or more analog circuit blocks. An IC device 100 can include an analog section 102 and a digital section 104, which can be integrated in a same IC substrate or package.

An analog section 102 can include a fixed analog circuit block 106, a reconfigurable amplifier circuit block 108, an analog routing block 110, a reconfigurable analog circuit with switching network 112, and an analog multiplexer (MUX) 114. An IC device 100 can receive input signals and provide output signals via input/outputs (I/Os) 116. Any of I/Os 116 can be connected to analog section 102 via a reconfigurable I/O routing 118 and/or can have direct connections to the analog section 102.

A fixed analog circuit block 106 can include one or more analog circuits having a fixed function. In some embodiments, a fixed analog circuit block 106 can include a data conversion circuit, including but not limited to an analog-to-digital converter (ADC). In particular embodiments, a fixed analog circuit block 106 can include a successive-approximation register (SAR) type ADC circuit.

A reconfigurable amplifier circuit block 108 can include amplifier circuits that can be reconfigured into various analog circuits. In some embodiments, such amplifiers can be operational amplifiers (op amps) which can be reconfigured into numerous circuits, including but not limited to single-stage and multi-staged op amp based circuits with various feedback configurations, filters, comparators, or buffers, to name only a few. A reconfigurable amplifier circuit block 108 can have built-in passive circuit components having configurable connections to other circuit components and/or it can be connected to passive circuit components via I/Os 116 or other connections (not shown) to the IC device 100. A reconfigurable amplifier circuit block 108 can be conceptualized as a "continuous-time" circuit block, as analog operations can occur in a continuous time domain.

A reconfigurable analog circuit with switching network 112 can include analog circuits with an accompanying switching network. Such a switching network can include switches connected to nodes that can be controlled by different clock signals, individually or in groups. Such an arrangement can enable the formation of switched-capacitor type circuits. In particular embodiments, a reconfigurable analog circuit with switching network 112 can include op amps with reconfigurable connections to a switched capacitor network. As in the case of reconfigurable amplifier circuit block 108, a reconfigurable analog circuit with switching network 112 can have built-in passive circuit components having configurable connections to other circuit components and/or it can be connected to passive circuit components via I/Os 116 or other connections to the IC device. A reconfigurable analog circuit with switching network 112 can be conceptualized as a "discrete-time" circuit block, as analog operations can occur in a discrete time domain when a switching network is employed.

Analog MUX 114 can selectively connect some or any of I/Os 116 to analog routing block 110. In some embodiments, analog MUX 114 can provide one or more direct connections to fixed analog circuit block 106. An analog MUX 114 can include more than two types of signal paths: a standard signal path 120 and a low resistance and/or low noise signal path 122. A low resistance/noise signal path 122 can include conductive lines and/or switch elements having a lower resistance than the standard signal paths and/or shielding or other structures. In some embodiments, a low resistance/noise signal path 122 can include one or more pairs of signal paths, enabling the input of one or more differential signal pairs.

An analog routing block 110 can include a reconfigurable routing network that can connect any of the analog blocks (106, 108, 112, 114) to one another. An analog routing block 110 can also connect some or all of the analog blocks (106, 108, 112, 114) to digital section 104. In the embodiment shown, analog block 110 can include at least two different types of signal routing: a standard routing (understood to exist throughout the block) and a low resistance and/or low noise routing 124. A low resistance/noise routing 124 can include conductive lines and/or switch elements having a lower resistance than the standard routing and/or shielding or other noise reduction structures. Like the analog MUX 114, in some embodiments, a low resistance/noise routing 124 can enable the formation of matching signal paths, enabling the routing of one or more differential signal pairs. In the particular embodiment of FIG. 1, there can additional low resistance/noise signal paths 126 from analog routing block 110 and fixed analog circuit block 106.

Referring still to FIG. 1, a digital section 104 can include any of: a reconfigurable digital block 128, control and sequencing circuits 130, a processor interface (I/F) 132, or a digital system interconnect (DSI) 131, for connecting to digital circuits. A reconfigurable digital block 128 can include reconfigurable digital circuits. Control and sequencing circuits 130 can provide control signals for executing predetermined operations, including analog circuit functions. As but one example, control and sequencing circuits can include state machines, or other structures, for controlling operations of circuits within fixed analog circuit block 106. A processor I/F 132 can include signal path connection suitable to communicate with a processor bus. In particular embodiments, processor I/F 132 can include an address bus for receiving addresses, a control bus for receiving instructions, a read data bus for outputting read data, and a write data bus for receiving write data. In one very particular embodiment, a processor I/F 132 can be compatible with the Advanced High-performance Bus (AHB) protocol promulgated by ARM, Ltd. of Cambridge, England.

In operation, an IC device 100 can provide highly diverse analog signal routing between any of the analog blocks (106, 108, 112, 114) and between the I/Os 116 and analog blocks (106, 108, 112, 114) by operation of reconfigurable analog routing block 110. This, along with the integration of digital section, can enable signal processing in the same device across various domains, including a continuous time domain (e.g., fixed analog circuit block and/or reconfigurable amplifier circuit block 108), discrete time domain (e.g., reconfigurable analog circuit with switching network 112 implementing a switched capacitor network), and a digital domain (e.g., reconfigurable digital blocks 128).

In addition, an IC device 100 can enable the formation of low resistance and/or low noise signal paths for high performance applications. Further, such signals can include differential signal pairs. According to embodiments, an analog MUX 114 can be configured to connect one or more I/Os 116 via its low resistance/noise signal path(s) 122 to analog routing block 110. Analog routing block 110 can be configured to route such signals paths, using low resistance/noise routing 124, to a desired analog circuit. In some embodiments, signal routing can be to fixed analog circuit block 106 and/or reconfigurable amplifier circuit block 108, via low resistance/noise signal paths 126.

Figure 2:
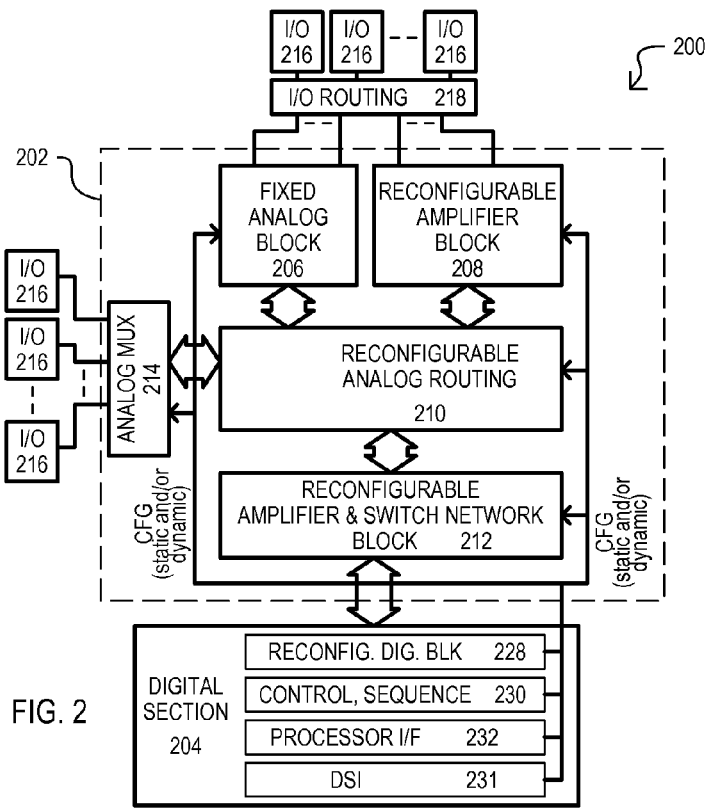
FIG. 2 is a block schematic diagram of an IC device according to an embodiment having analog sections controllable and/or configurable from multiple sources.

FIG. 2 is a block schematic diagram of an IC device 200 according to another embodiment. FIG. 2 shows an IC device 200 having an analog section with a highly flexible reconfigurable fabric that can be configured and controlled according to various paradigms. An IC device 200 can include items like those of FIG. 1, and such like items are referred to by the same reference characters but with the first digit being a "2" instead of a "1".

FIG. 2 differs from FIG. 1 in that is shows configuration and control values (CFG) applied to various blocks (206, 208, 210, 212, 214) of the analog section 202. Values CFG can configure the various blocks for particular functions and in some cases control how such functions are executed.

As shown in FIG. 2, values CFG can originate from any of multiple sources, including: reconfigurable digital blocks 228, control and sequencing circuits 230, processor interface 232, or DSI 231. Values CFG can be static or dynamic, enabling analog functions of analog section 202 to be set and then changed if desired. This is in contrast to conventional approaches in which configuration data for reprogrammable sources are loaded into a set of registers from a single source.

In this way, IC device 200 can provide a wide range of configuration/control paradigms for reconfigurable analog circuits. For example, reconfigurable analog blocks can operate under dedicated logic on the IC device itself, or via another processor based device (e.g., microcontroller) via the processor interface 132.

Figure 3:
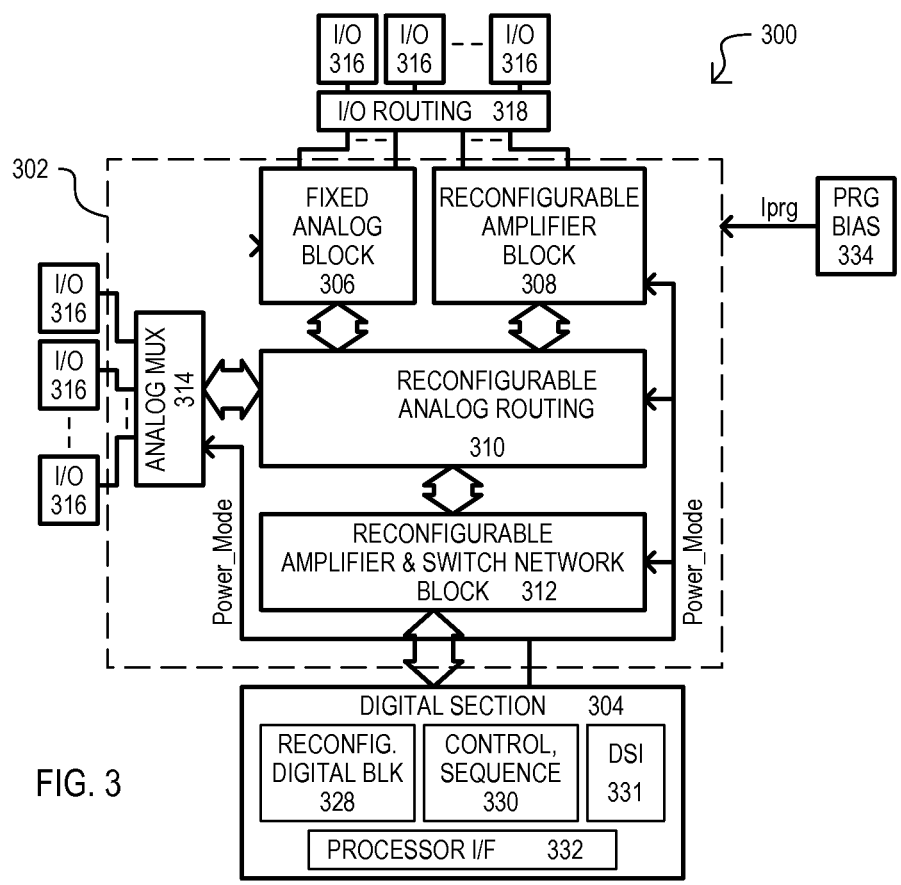
FIG. 3 is a block schematic diagram of an IC device according to an embodiment having multiple modes of operation.

FIG. 3 is a block schematic diagram of an IC device 300 according to further embodiment. FIG. 3 shows an IC device 200 having fixed and reprogrammable analog sections that can be placed into numerous power consumption modes, including two or more modes in which an analog blocks remains operational. An IC device 300 can include items like those of FIG. 1, and such like items are referred to by the same reference characters but with the first digit being a "3" instead of a "1".

FIG. 3 differs from FIG. 1 in that is shows power mode values Power_Mode applied to various blocks (306, 308, 310, 312, 314) of the analog section 302. Power_Mode values can place the various blocks into different modes of operation that consume different amounts of power. In the particular example shown, Power_Mode values can correspond to three different modes: ACTIVE, SLEEP and HIBERNATE. In an ACTIVE mode of operation, the various blocks (306, 308, 310, 312, 314) can have full functionality. In a SLEEP mode of operation, all or selected of the blocks (306, 308, 310, 312, 314) can consume less power than in the ACTIVE mode. However, in the SLEEP mode all or selected of the blocks (306, 308, 310, 312, 314) can be functional, but operate at a different performance level than in the ACTIVE mode. In a HIBERNATE mode, all or selected of the blocks (306, 308, 310, 312, 314) can consume less power than in the SLEEP or ACTIVE mode. Further, in a HIBERNATE mode, all or selected of the blocks may have no functionality.

Referring still to FIG. 3, an IC device 300 can also include a programmable bias circuit 334. A programmable bias circuit 334 can provide a bias current Iprg (e.g., power) to selected of the blocks (306, 308, 310, 312, 314) in a SLEEP or HIBERNATE power mode, to enable such block(s) to continue to be functional. Such a bias current (Iprg) can be programmable to enable the corresponding blocks to operate at a desired performance level. According to embodiments, Iprg can be programmed to less than or greater than a bias current provided to a corresponding circuit in the ACTIVE mode. In very particular embodiments, Iprg can range from a value having a low that is less than 5% of a current provided in an active mode, to a high that is more than 150% of the current provided in the active mode. In the latter case, performance may be increased over that of the ACTIVE mode. In one very particular embodiment, programmable bias current 334 can provide a bias current to amplifier circuits within reconfigurable amplifier block 308.

In this way, portions of a reconfigurable analog circuit block can remain operational in both a standard mode of operation (e.g., ACTIVE) and a lower power mode of operation (e.g., SLEEP).

Figure 4:
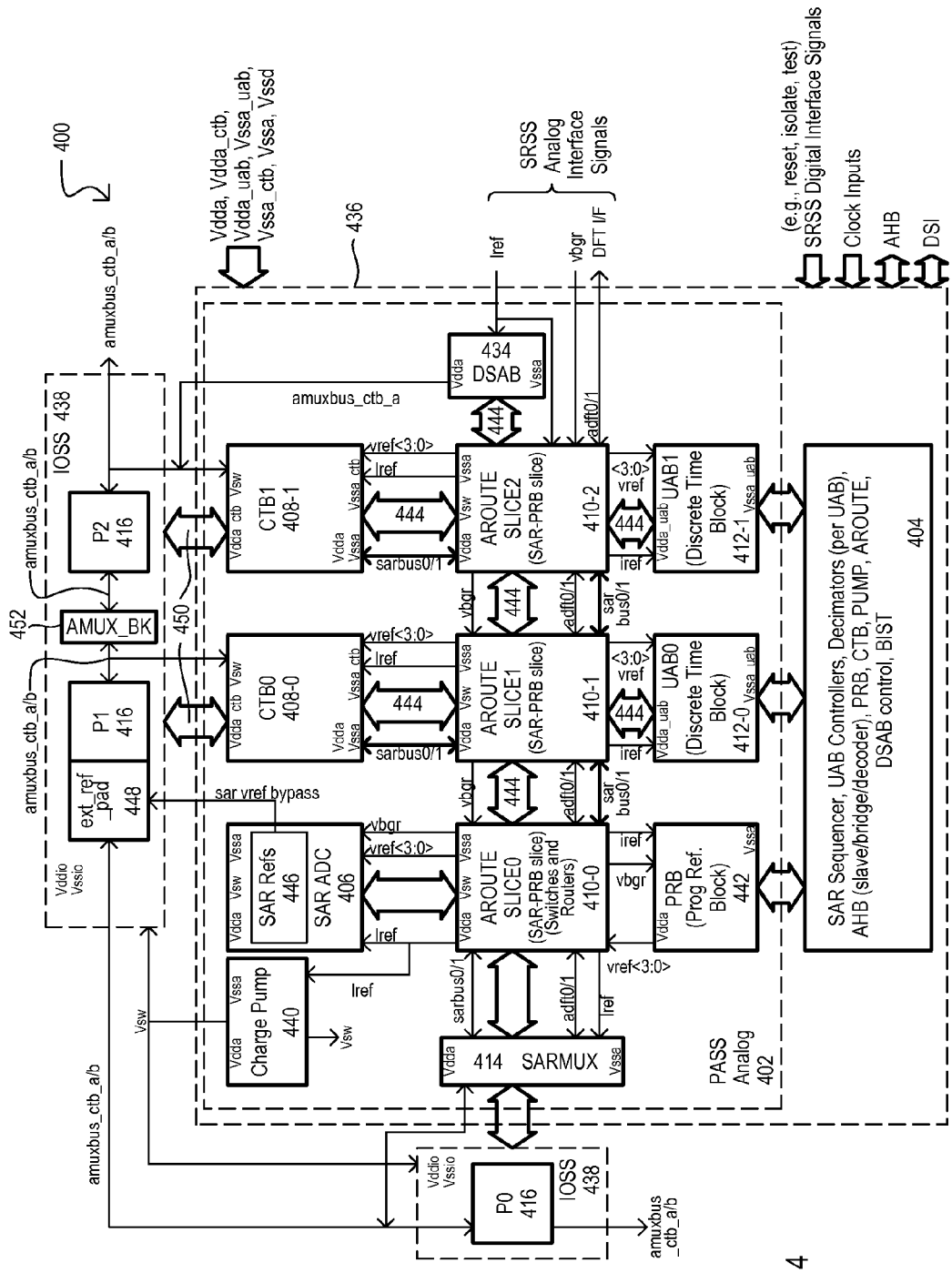
FIG. 4 is a detailed block schematic diagram of an IC according to another embodiment.

Referring now to FIG. 4, an IC device 400 according to one detailed embodiment is shown in block schematic diagram. An IC device 400 can include a programmable analog subsystem PASS 436 and an I/O subsystem (IOSS) 438. PASS 436 can include an analog section 402 and a digital section 404. Circuits within analog section 402 can include fixed and reconfigurable analog circuits which can be configured and controlled by circuits within digital section 404.

Analog section 402 can include an SAR ADC circuit 406, continuous time (CT) blocks 408-0/1, analog routing blocks 410-0 to -2, universal analog blocks 412-0/1, an SAR MUX 414, an amplifier bias circuit 434, a charge pump 440, and a programmable reference block (PRB) 442. According to embodiments, any of the analog section 402 circuit blocks (i.e., 440, 406, 408-0/1, 410-0 to -2, 412-0/1, 414, 442) can operate across different power modes, like those described as ACTIVE, SLEEP and HIBERNATE with reference to FIG. 3.

An SAR ADC 406 can receive input signals from and provide output signals to analog routing 444. In some embodiments, SAR ADC 406 can also provide digital output values (e.g., conversion values) to digital section 404. An SAR ADC 406 can be a high resolution circuit providing output values of 12-bits or greater. In the embodiment shown, SAR ADC 406 can receive a reference current Iref, up to four reference voltages (vref<3:0>), and a bandgap reference voltage (vbgr) for use in conversion operations. SAR ADC 406 can include a reference section 446 which can provide a reference value to a reference I/O 448 (e.g., pad) of the IC device 400. SAR ADC 406 can receive high and low analog power supplies (Vdda, Vssa) as well as a switching power supply Vsw.

CT blocks 408-0/1 can include reconfigurable analog circuits for executing signal processing in a continuous time domain. In some embodiments, CT blocks 408-0/1 can include op amps reconfigurable into various analog circuits. Each of CT blocks 408-0/1 can receive input signals from and/or provide output signals to IOSS 438 via corresponding I/O connections 450. In addition, each of CT blocks 408-0/1 can receive input signals from and/or provide output signals to analog routing 444. Still further, each CT block 408-0/1 can be connected to a low resistance and/or low noise routing (sarbus0/1). In the embodiment shown, CT blocks 408-0/1 can receive high and low analog power supplies (Vdda, Vssa), a switching power supply (Vsw), as well as a block power supplies (Vdda_ctb, Vssa_ctb). Further, CT blocks 408-0/1 can receive a reference current Iref and up to four reference voltages (vref<3:0>) via analog routing blocks 410-0 to -2 or directly from PRB 442.

CT blocks 408-0/1 can include op amps reconfigurable into various "front-end" functions of an analog system. As but two examples, op amps within CT blocks 408-0/1 can be configured into a class-A mode to amplify analog input signals or can be configured into a class-AB mode to drive output analog signals (on an I/O 416, for example).

Analog routing blocks 410-0 to -2 can provide reconfigurable analog routing between SAR ADC 406, CT blocks 408-0/1, UABs 412-0/1, SAR MUX 414 and amplifier bias circuit 434, via analog routing 444. Analog routing blocks 410-0 to -2 can also provide reconfigurable low resistance/ noise routing (via sarbus0/1) between SAR MUX 414 and CT blocks 408-0/1. Analog routing blocks 410-0 to -2 can also route reference voltages to the various blocks, including: the four reference voltages (vref<3:0>) from PRB 442 to any of SAR ADC 406, CT blocks 408-0/1 or UABs 412-0/1; the bandgap voltage (vbgr) to SAR ADC 406 and/or PRB 442; and a reference current (Iref) to any of charge pump 440, SAR ADC 406, CT blocks 408-0/1, SAR MUX 414, PRB 442, or UABs 412-0/1. In the embodiment shown, analog routing blocks 410-0 to -2 can also route signal paths (adft0/1) for a design-for-test I/F (not shown).

UABs 412-0/1 can include additional reconfigurable analog circuits, including amplifiers and a switch network for implementing switched capacitor type circuits. Each of UABs 412-0/1 can receive input signals from and/or provide output signals to analog routing 444. In some embodiments, UABs 412-0/1 can be configured to provide ADC functions, such as sigma-delta ADC conversion, for example. However, in other embodiments, UABs 412-0/1 can be configured into digital-to-analog converters (DACs). In the embodiment shown, UABs 412-0/1 can receive block power supplies (Vdda_uab, Vssa_uab). Further, CT blocks 408-0/1 can receive a reference current Iref and up to four reference voltages (vref<3:0>) via analog routing blocks 410-0 to -2.

An SAR MUX 414 can connect a set of I/Os 416 to analog routing blocks 410-0 to -2, and hence to any of SAR ADC 406, CT blocks 408-0/1 or UABs 412-0/1. Further, in the embodiment shown, SAR MUX 414 can provide a direct connection between I/Os 416 and a low resistance/noise bus (sarbus0/1). SAR MUX 414 can also receive a reference current Iref and analog power supplies (Vdda, Vssa). In a particular embodiments, a SAR MUX 414 can provide no less than 8:1 multiplexing.

Amplifier bias circuit 434 can generate bias currents for analog circuits within the analog section 402, such as amplifier circuits, as but one example. These bias currents can enable analog circuits to remain operational in low power modes of operation. In addition, these bias currents are programmable to provide a wide range of values. In the embodiment shown, such bias currents can be provided by way of analog routing 444. In addition, bias current can provided via an analog MUX bus (amuxbus_ctb_a/b). In very particular embodiments, bias currents can be routed to amplifiers within CT blocks 408-0/1 and/or UABs 412-0/1 in a lower power mode, such as SLEEP.

A charge pump 440 can generate pump voltages from analog power supply (Vdda, Vssa). In some embodiments, pump voltages can be outside of the provided power supply range (i.e., greater than Vdda or less than Vssa). In the particular embodiment shown, charge pump 440 can generate a switch voltage Vsw. A switch voltage Vsw can be used to lower a resistance of switches within routing networks.

A PRB 442 can provide programmable reference values for use by some or all analog blocks (406, 408-0/1, 412-0/1, 406, 440). Reference values can be voltages or currents. In the particular embodiment shown, PRB 442 can provide four reference voltage vref<3:0>, each of which is a programmable value. A bandgap reference voltage (vbgr) can be used to ensure reference voltages vref<3:0> are stable over a range of temperatures. In some embodiments, reference values can be connected to other analog blocks via analog routing blocks 410-0 to -2. In addition or alternatively, an IC device 400 can include a reference value routing network that provides reference values to an analog block independent of analog routing blocks 410-0 to -2.

IOSS 438 can include various I/Os 416 of the IC device 400. An IOSS 438 can also include an analog MUX 452, which can selectively connect any of I/Os 416 to analog MUX bus (amuxbus_ctb_a/b). IOSS 438 can receive an I/O power supply (Vddio, Vssio). It is understood that in FIG. 4, each of I/Os 416 can represent multiple physical I/Os to IC device 400.

A digital section 404 can provide control and sequencing signals for various portions of the analog section 402. As will be shown in other embodiments below, a digital section 404 can include various circuits for controlling analog circuit operations. In the particular embodiment shown, digital section 404 can include: an SAR Sequencer for controlling conversion operations of SAR ADC 406; UAB Controllers for controlling operations within UABs 412-0/1, such as switch capacitor network controls; decimator controls such as those used in delta-sigma ADC operations; as well as control/configuration signals for PRB 442, CT blocks 408-0/1, charge pump 440, analog routing blocks 410-0 to -2, and amplifier bias circuit 434. Digital section 404 can further include a processor interface, which in this embodiment is an AHB compatible interface, as built-in self-test (BIST) controls, and a DSI.

In some embodiments, digital section 404 can include logic circuits that can provide digital processing of analog signals originating in analog section 402 (or from a source external to PASS 436).

According to embodiments, digital section 404 can integrate the various functions having different control paradigms (e.g., static, dynamic, state machine control, or event driven) into one or more signals paths within the PASS 436.

According to embodiments, digital control of analog circuits within analog section 402 can be according to registers (firmware), finite state machine and also event driven control capability included within, or derived from, circuits within digital section 404, including external events via a DSI.

As shown in FIG. 4, PASS 436 can receive various power supply voltages (Vdda, Vdda_ctb, Vdda_uab, Vssa_uab, Vssa_ctb, Vssa, and Vssd). In addition, PASS 436 can have various digital signal connections, including interface signals (e.g., reset, isolate, test), clock inputs, an AHB compatible bus, and a digital bus which can be connected to other digital circuits of the IC device (not shown), such as reconfigurable digital blocks.

Having described various structures included within IC device 400, particular configurations/operations of the IC device will now be described.

According to some embodiments, analog blocks within analog section 402 can be configured into any of: low offset-noise front ends (by utilizing low resistance/noise bus sarbus0/1), ADCs, digital-to-analog converter (DACs), programmable gain amplifiers (PGAs), Filters (both analog and digital), other programmable amplifiers, mixers, modulators, integrators, summers, programmable references and a very large number of switched capacitor functions. Such functions can be controlled across various signal paths, along with the routing of corresponding signals. Such control can be static or dynamic. Multiple analog blocks can be chained together to create higher order transfer functions in not only a single-ended fashion, but also a differential-like fashion.

The reconfigurability provided by PASS 436 can be conceptualized being (a) topological, (b) functional and (c) parametric. Topological configurability can be the ability to make different topological choices for a given function. For example, two UABs 412-0/1 can be configured as switched capacitor biquad filters. The flexibility in configuration provided by PASS 436 can enable the filter to be configured as a Gregorian-Temes type biquad filter or a Tow-Thomas type biquad filter. Similarly, a UAB 412-0/1 can be configured into a sigma-delta modulator with a traditional feedback topology, or one with an optional feedforward path. Functional configurability can be the ability of one block to be configured into various different functions. For example, a CT block 408-0/1 can be configured into various functional modes, including but not limited to a buffer, an inverting amplifier, a non-inverting amplifier, a differential programmable gain amplifier, a comparator with hysteresis, or a window comparator. Such variations in function can also be provided by a UAB 412-0/1. Parametric configurability can be the ability to control the parameters of the operation. Examples can include changes in gain, signal-to-noise ratio (SNR), data rate, or the ability to operate in a continuous time or discrete time fashion. Other examples can include operating in a voltage mode or current mode.

The high degree of configurability provided by a PASS 436 or equivalent arrangement, can enable optimization of analog functions, as tradeoffs can be made amongst performance parameters (e.g., SNR, speed, and power).

Possible configurations of an IC device 400 include, but by no means are limited to: a 12-bit, SAR ADC operating at 1 Msps; a 14-bit incremental ADC operating at 100 sps; a 12-bit multiplying DAC operating at 500 ksps; rail-to-rail amplifiers with a high drive capability (up to 10 mA); reconfigurable switched capacitor filters; and a wide variety of amplifier, mixer, filter and comparators configurations. Such configurations are possible by chaining several blocks of an analog section 402. For example, UAB blocks can be chained to create higher order filters and sigma-delta modulators.

In one very particular embodiment, an IC device 400 can be configured to provide a 70 dB SNR channel using a 10 kHz 128 mV amplitude input signal. Input signals can be provided via a pair of I/Os 416, and amplified by a differential amplifier configured within a CT block (408-0/1) to have a gain of 8 and in a low-pass configuration with a cut-off frequency of 100 kHz. Signals can be further amplified differentially by amplifiers within a UAB (412-0/2) with a gain of 2. A resulting amplified signal can then be provided to SAR ADC, which can be a 12-bit ADC sampling differentially at 600 ksps using a properly bypassed 2.048V reference (from PRB 442). Supply conditions can include Vdda=2.7 V.

As noted herein, a PASS 436 can be placed into different power modes, including ACTIVE, SLEEP and HIBERNATE. As also noted herein, while other circuit sections are placed into low current, non-operational modes, selected components can remain operational. Further, the performance of such components can be configurable. For example, a bias current from an amplifier bias circuit 434 can enable some amplifiers to remain operational. In a very particular embodiment, a PASS 436 can occupy 3.2 mm$^2$, and a sum of the quiescent currents from its various blocks can be about 16.25 mA. However, in a SLEEP mode, power consumption of a single CT block amplifier with a 50 kHz bandwidth and power supply (Vdd) of 2.7 volts can be less than 20 uA. Thus, circuit components can remain operational in SLEEP mode but consume very little power.

According to some embodiments, in a SLEEP mode, a bias current available to CT blocks (408-0/1) in the ACTIVE mode can be shut down. However, a bias current from an amplifier bias circuit 434 can be provided for use by CT blocks (408-0/1). In one very particular embodiment, in an ACTIVE mode, a bias current for a CT block (408-0/1) can be generally constant at about 2.4 uA. In a SLEEP mode, an amplifier bias circuit 434 can provide a current to CT blocks (408-0/1) having a positive temperature coefficient that is programmable between about 0.075 uA to about 4.6 uA.

Accordingly, by operation of amplifier bias circuit 434, CT blocks (408-0/1) are able to remain operational in the SLEEP mode. However, in some cases, the CT blocks (408-0/1) will operate at reduced specifications (as compared to the ACTIVE mode) depending on the bias current chosen for the amplifier bias circuit 434.

In some embodiments, in a SLEEP mode, a CT block (408-0/1) can be configured as an amplifier or a comparator. A bandwidth of such an amplifier with low bias current value (e.g., about 160 nA) can be in the order of 120 kHz. Power supply requirements for a CT block (408-0/1) can be set to 2.7 V, as a charge pump 440 can be turned off.

In one very particular embodiment, within analog section 402, in a SLEEP mode, charge pump 440, SAR ADC 406, PRB 442 and UABs 412-0/1 can be turned off (i.e., are not operational). However, CT blocks (408-0/1), analog routing blocks (410-0/1), SAR MUX 414 and amplifier bias circuit 434 can remain operational (though at lower performance, as noted above).

Particular examples of configurations for an IC device 400 will now be described. It is understood that these configurations are provided by way of example only, the PASS 436 being reconfigurable into vast assortment of different circuit implementations.

FIGS. 5A and 5B show an IC device 400 configured to include an unbuffered, differential signal path. FIG. 5A shows a portion of IC device 400. A differential signal path 522 can begin at I/Os 416 (P0), and pass through a channel of SAR MUX 414. Routing within analog routing block 410-0 can connect the signal path to a fixed function analog circuit (the SAR ADC 406, in this embodiment). Switches used in the SAR MUX 414 are represented by 552. Switches used in analog routing block 410-0 are represented by 554. Switches used in the SAR ADC 406 are represented by 556. In a particular embodiment, differential signal path 522 can be implemented all, or in part, with the low resistance/noise bus sarbus0/1.

FIG. 5B shows the differential signal path 522 of FIG. 5A in a schematic diagram. The differential signal path 522 includes physical connections of the IC device 516-0/1 (e.g., pins). Structures from the connections to the SAR MUX 414 can present a resistance shown as Resd. In particular embodiments, this can include electrostatic discharge (ESD) protection structures. An equivalent resistance/capacitance of the SAR MUX is represented by resistance RSARmux and C50. An equivalent resistance/capacitance of the path through analog routing block 410-0 is represented by resistance Raroute and C52. Lastly, an equivalent resistance/capacitance at an input of SAR ADC is represented by resistance RSAR and C54.

In a very particular embodiment, Resd=150Ω, RSARmux=255Ω, C50=1.13 pF, Raroute=100Ω, C52=3.6-6.5 pF, RSAR=700Ω, and C54=8 pF. It is understood, that in such an implementation, a charge pump 440 is active to generate switch control voltages that provide low switch resistance.

In this way, an unbuffered, differential analog signal path can be configured within a PASS 436 of IC device 400.

FIGS. 6A and 6B show an IC device 400 configured to include a buffered, differential signal path. FIG. 6A shows a portion of IC device 400. A differential signal path 622 can begin at I/Os 416 (P0), and pass through a channel of SAR MUX 414. Switches used in SAR MUX 414 are represented by 652. The differential signal path 622 can be routed through analog routing block 410-0 to analog routing block 410-1 and on to CT block 408-0. Switches used in analog routing block 410-0 are represented by 654. Switches used in analog routing block 410-1 are represented by 658.

CT block 408-0 can be configured to provide buffers for the differential signal path 622. In one very particular embodiment, op amps can be configured as unity gain buffers. Buffered signals from CT block 408-0 can be routed back through analog routing block 410-1 to analog routing block 410-0. Routing within analog routing block 410-0 can connect the differential signal path 622 to a fixed function analog circuit (SAR ADC 406). Switches used in SAR ADC are represented by 656. In a particular embodiment, differential signal path 622 can be implemented all, or in part, with the low resistance/noise bus sarbus0/1.

FIG. 6B shows the differential signal path 622 of FIG. 6A in a schematic diagram. The differential signal path 622 includes physical connections of the IC device 616-0/1 (e.g., pins). Signal path passes through SAR MUX 414 and analog routing blocks 410-0/1. Within CT block 408-0, op amps can be configured into two unity gain buffers 660. Outputs from buffers 660 can be routed back through analog routing blocks 410-0/1 to SAR ADC 406. SAR ADC 406 can provide a digital output of x-bits, representing a conversion value. In some embodiments, x is no less than 12. In the particular embodiment shown, SAR ADC 406 can receive reference voltages from PRB 442.

FIGS. 7A and 7B show an IC device 400 configured to include a differential signal path having a driven front end and amplified signal path. FIG. 7A shows a portion of IC device 400. A differential signal path 722 can begin at I/Os 416 (P1) which can be connected to CT block 408-0. CT block 408-0 can be configured to provide buffers for signals received at I/Os 416 (P1). In one very particular embodiment, op amps within CT block 408-0 can be configured as unity gain buffers. Buffered signals from CT block 408-0 can be routed through analog routing block 410-1 to UAB 412-0. Switches used in analog routing block 410-1 are shown as 758.

UAB 412-0 can be configured to provide amplifiers for the signal path 722. In one very particular embodiment, op amps can be configured as switched-capacitor type programmable gain amplifiers (PGAs) 762. Amplified signals from UAB 412-0 can be routed back through analog routing block 410-1 to analog routing block 410-0. Switches used in analog routing block 410-0 are shown as 756. Routing within analog routing block 410-0 can connect the signal path 722 to a fixed function analog circuit (SAR ADC 406). Switches used in SAR ADC are represented by 756. In a particular embodiment, differential signal path 722 can be implemented all, or in part, with the low resistance/noise bus sarbus0/1.

FIG. 7B shows the signal path 722 of FIG. 7A in a schematic diagram. The signal path 722 includes physical connections of the IC device 716-0/1 (e.g., pins). Signals at connections 716-0/1 can be buffered by unity gain buffers 760 implemented within CT block 408-0. The signal path 722 passes through analog routing block 410-0 to UAB 412-0. Within UAB 412-0, signals can be amplified by PGAs 762. Outputs from PGAs 762 can be routed back through analog routing blocks 410-0/1 to SAR ADC 406. SAR ADC 406 can provide a digital output of x-bits, representing a conversion value, as the case of FIG. 6B. Passive elements (i.e., capacitors) utilized in the signal path can be formed within the IC device, connected to the IC device, or combinations thereof.

FIGS. 8A and 8B show an IC device 400 configured to include a differential signal path having a continuous time filtered front end and an amplified signal path. FIG. 8A shows a portion of IC device 400. A differential signal path 822 can begin at I/Os 416 (P1) which can be connected to CT block 408-0. CT block 408-0 can be configured to provide filters for signals received at I/Os 416 (P1). In one very particular embodiment, op amps within CT block 408-0 can be configured as first order filters. Filtered signals from CT block 408-0 can be routed through analog routing block 410-1 to UAB 412-0. Switches used in analog routing block 410-1 are shown as 858.

UAB 412-0 can be configured to provide amplifiers for the signal path 822. In one very particular embodiment, op amps within UAB 412-0 can be configured as in FIG. 7B (PGAs). Amplified signals from UAB 412-0 can be routed back through analog routing block 410-1 to analog routing block 410-0. Switches used in analog routing block 410-0 are shown as 856. Routing within analog routing block 410-0 can connect the signal path 822 to a fixed function analog circuit (SAR ADC 406). Switches used in SAR ADC are represented by 856. In a particular embodiment, differential signal path 822 can be implemented all, or in part, with the low resistance/noise bus sarbus0/1.

FIG. 8B shows the signal path 822 of FIG. 8A in a schematic diagram. The signal path 822 includes physical connections of the IC device 816-0/1 (e.g., pins). Signals at connections 816-0/1 can be filtered by first order filters 864 implemented within CT block 408-0. The signal path 822 passes through analog routing block 410-0 to UAB 412-0. Within UAB 412-0, signals can be amplified by PGAs 862. Outputs from PGAs 862 can be routed back through analog routing blocks 410-0/1 to SAR ADC 406. SAR ADC 406 can provide a digital output of x-bits, representing a conversion value, as the case of FIG. 6B. Passive elements (i.e., resistors, capacitors) utilized in the signal path can be formed within the IC device, connected to the IC device, or combinations thereof.

According to embodiments, analog blocks, be they fixed function or reconfigurable, can include one or more circuit resources. The use of such circuit resources can vary on a per block basis according to configuration. That is, in one configuration some resources of an analog circuit block can be employed. However, in another configuration a different set of resources can be used. FIGS. 8C and 8D are diagrams showing one particular example of such an arrangement.

FIGS. 8C and 8D show an IC device in a first configuration (400-0) and a second configuration (400-1). The different configurations can utilize different sets of analog circuit resources within a same analog circuit block. In the embodiment shown, CT block 408-0 can include analog circuit resources 857-0 to -2, while UAB 412-0 can include analog circuit resources 857-3/4. It is understood that while FIGS. 8C and 8D show analog circuit resources as amplifiers, such resources can include various other circuit or circuit elements, including but not limited to: switching networks, passive circuit elements, and various other circuits such as current mirrors, transistor differential pairs, reference voltage/current generators, or comparators, to name just a few.

FIG. 8C shows the IC device in a first configuration 400-0. A signal processing path 822-0' can utilize analog circuit resource 857-0 of CT block 408-0 and analog circuit resource 857-3 of UAB 412-0. In contrast, as shown in FIG. 8D, in device configuration 400-1, a signal processing path 822-1' can utilize analog circuit resources 857-1/2 of CT block 408-0 and analog circuit resource 857-4 of UAB 412-0.

Of course, analog circuit resource use need not be mutually exclusive between configurations. Some configurations can have analog circuit resource use that overlap with other configurations. As noted herein, in some embodiments, an IC device can switch between configurations dynamically.

Figure 9:
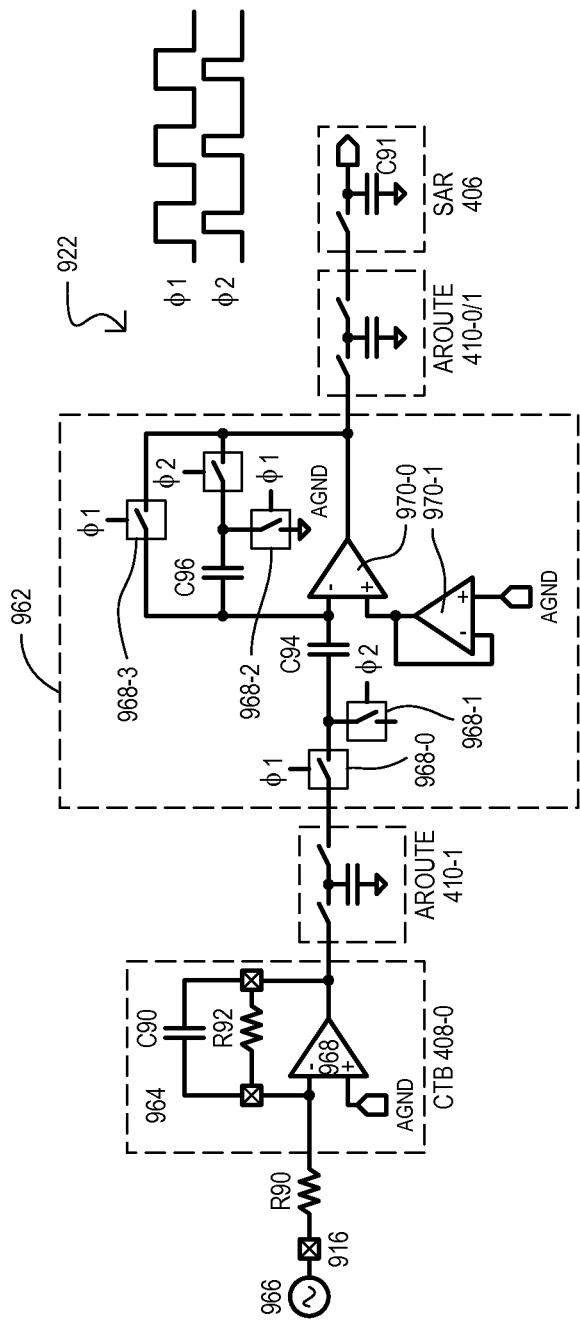
FIG. 9 is a schematic diagram showing a half-signal path like that shown in FIG. 8B.

FIG. 9 is a half circuit diagram showing one particular implementation of a signal path like that shown in FIGS. 8A and 8B. An input signal 966 at an input connection 916 (pin) can be a 128 mV peak-to-peak signal. Such a signal can be input to a first order filter 964 formed within CT block 408-0. Circuit elements for the filter 964 of CT block 408-0 can have the following properties: R90=21 kΩ, R92=171 kΩ and C90=9.3 pF. Op amp 968 can have an open loop gain of 100 dB and a unity gain frequency (Ft) from about 8 MHz to about 33 MHz.

An output from filter 964 can be routed through analog routing block 410-1 to UAB 412-0, which can be configured into a switched capacitor type PGA 962. Circuit elements for the PGA 962 can have the following properties: C94=2.4 pF, C96=1.2 pF. PGA op amp 970-0 can have A=100 dB, Ft=12 MHz. Ground buffer op amp 970-1 can have A=80 dB, Ft=12 MHz. Switches (968-0 to -3) within PGA can switch according to non-overlapping clocks φ1 and φ2. In a very particular embodiment, a switching frequency (Fs) can be 63 KHz and clock φ1 can have a width of about 15 us, while clock φ2 can have a width of about 888 ns.

The output from PGA 962 can be routed through analog routing blocks 410-0/1 to SAR ADC 406. An input capacitance C91 of SAR ADC 406 can be 6.4 pF. SAR ADC 406 can use a reference voltage of 2.048 V. An SAR ADC 406 can have a throughput of about 600 ksps. A sampling frequency can be about 18 MHz, with a sampling number of N=16 (given 888 ns).

In the particular embodiment shown, signal path 922 can include a gain of 8× in CT block filter 964, which can have a 100 kHz BW. A UAB PGA 962 can have a gain of 2×. Because the CT block filter 964 BW is 100 kHz (as a filter), the UAB clock frequency (Fs) has been set to 63 KHz to meet the settling requirement. The UAB PGA 962 in feedback configuration is able to drive and settle into the SAR ADC input sampling capacitance (via analog routing blocks 410-0/1) to ½ LSB at 12 bits. The SAR ADC clock frequency is 18 MHz and the sampling aperture is 16 cycles to sample and fully settle the input. As noted, this would put the SAR ADC throughput at 600 ksps. Clock φ1 is long enough for the CT block filter 964 to settle. Clock φ2 is set for a narrower pulse width than clock φ1, since that is sufficient to drive into the SAR ADC 406 and settle to ½ LSB of 12 bits. The SAR ADC 406 sampling in the timing diagram is aligned with clock φ2, while the rest of the SAR ADC 406 activity, namely redistribution takes about 14 cycles, at the 18 MHz SAR clock.

Figure 10:
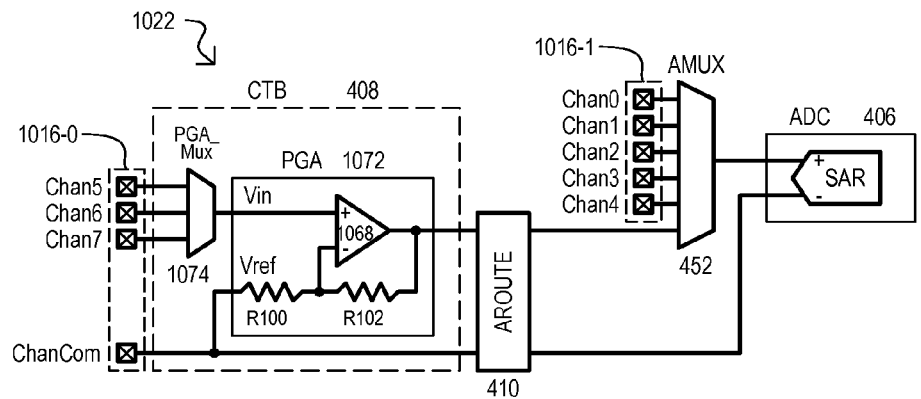
FIG. 10 is a schematic diagram of a scan analog-to-digital converter (ADC) path that can be implemented in an IC device like that of FIG. 4.

FIG. 10 shows another signal path that can be implemented in an IC device 400 like that of FIG. 4. FIG. 10 shows a scanning ADC signal path 1022. In the embodiment shown, signal path 1022 can be produced by configuring a CT Block 408, analog MUX 452, and one or more analog routing blocks 410.

A CT block 408 can be configured into a MUX 1074 and a PGA 1072 implemented with a CT block op amp 1068. One set of I/Os 1016-0 can serve as input channels (Chan5-7) and a common channel (ChanCom). Input channel (Chan5-7) can be provided as inputs to MUX 1074. The output of MUX 1074 can be the input to PGA 1072 via one or more analog routing blocks 410.

Another set of I/Os 1016-1 can serve as input channels (Chan0-4). Input channel (Chan0-4) can be provided as inputs to analog MUX 452. Another input to analog MUX 452 can be the output of PGA 1072. The output of analog MUX 452 can serve as a first input (+) to SAR ADC 406. The second input (−) to SAR ADC 406 can be the common channel (ChanCom) via one or more analog routing blocks 410.

In one particular embodiments, a PGA 1072 can be 16 and SAR ADC 406 can provide a 12-bit conversion output.

Figure 11:
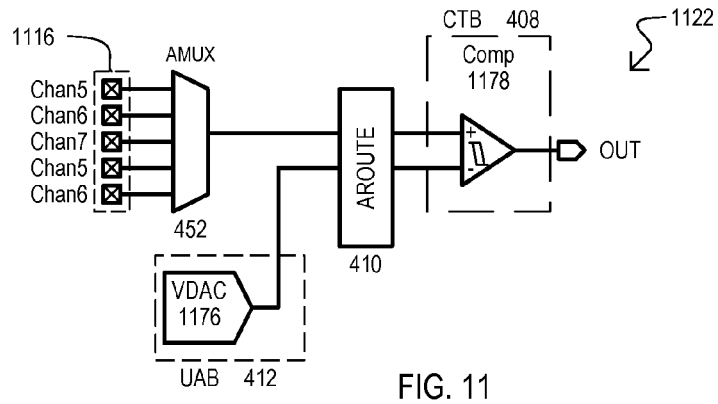
FIG. 11 is a schematic diagram of a scanning comparator path that can be implemented in an IC device like that of FIG. 4.

FIG. 11 shows a further signal path that can be implemented in an IC device 400 like that of FIG. 4. FIG. 11 shows a scanning comparator signal path 1122. In the embodiment shown, signal path 1122 can be produced by configuring an analog MUX 452, a UAB 412, a CT block 408, and one or more analog routing blocks 410.

A set of I/Os 1116 can serve as inputs to analog MUX 452. A UAB 412 can be configured into a voltage DAC (VDAC) 1176. A CT block 408 can be configured into a comparator 1178. An output from analog MUX 452 can be connected to a first input (+) of comparator 1178 via one or more analog routing blocks 410. An output from VDAC 1176 can be connected to a second input (−) of comparator 1178 via one or more analog routing blocks 410.

Figure 12:
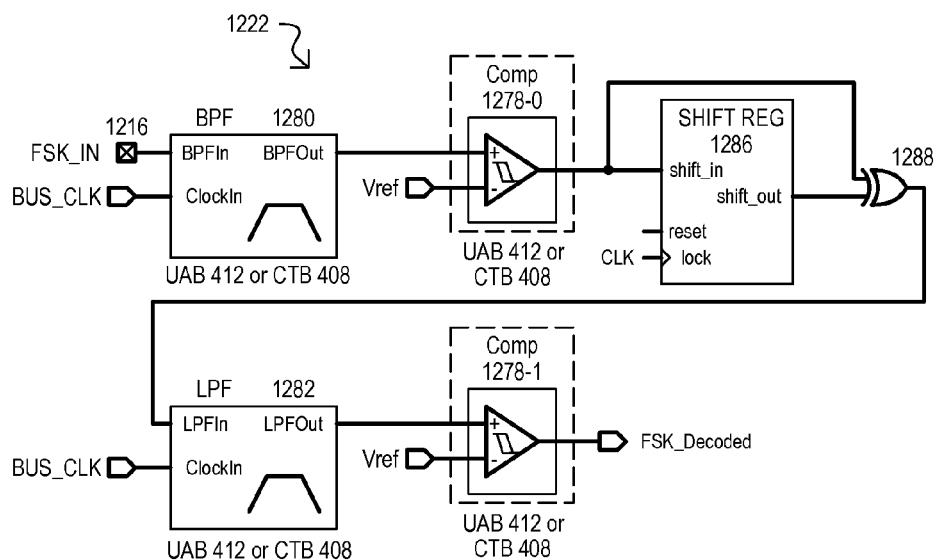
FIG. 12 is a schematic diagram of a frequency shift keying (FSK) path that can be implemented in an IC device like that of FIG. 4.

FIG. 12 shows another signal path that can be implemented in an IC device 400 like that of FIG. 4. FIG. 12 shows a frequency shift keying (FSK) signal path 1222. In the embodiment shown, signal path 1222 can be produced by configuring a CT Block 408 or UAB 412, and one or more analog routing blocks 410.

One or more UABs 412 can be configured into a band pass filter (BPF) 1280 and a low pass filter (LPF) 1282. In some embodiments, such filters can be switched capacitor type filters. Alternatively, one or both of BPF 1282 or LPF 1284 can be continuous time filters implemented within a CT block 408. Similarly, one or more UABs 412 can further be configured into comparators 1278-0/1. Alternatively, one or both of comparators 1278-0/1 can implemented within a CT block 408.

A signal path 1222 can further include a shift register 1286 and logic 1288. In some embodiments, such circuits can reside in a digital section (e.g., 404) of PASS 436. However, in other embodiments, such circuits can be present in a UAB 412 and/or CT Block 408. In the former case, signals from comparator 1278-0 can be routed to shift register 1286 via one or more analog routing blocks (and can also include level shifting).

An input signal (FSK_IN) can be received at an I/O 1216 (e.g., pin) and provided as an input to BPF 1280. In some embodiments, this can include routing via one or more analog routing blocks. In the embodiment shown, BPF 1280 can operate according to a clock signal BUS_CLK. An output of BPF 1280 can be provided as one input (+) to comparator 1278-0. The other input (−) can be a reference level Vref for distinguishing valid transitions. An output of comparator 1278-0 can be provided as an input to shift register 1286 and an input to logic 1288. Data can be shifted out of shift register 1286 according to clock CLK and provided as a second input to logic 1288.

An output from logic 1288 can be provided as an input to LPF 1282. In some embodiments, this can include routing via one or more analog routing blocks (and possible level shifting). In the embodiment shown, LPF 1282 can also operate according to a clock signal BUS_CLK. An output of LPF 1282 can be provided as one input (+) to comparator 1278-1. The other input (−) can be a reference level Vref for distinguishing valid transitions. An output from comparator 1278-1 can be a decoded bit stream (FSK_Decoded). Such an output can be provided to any suitable communication component, such as a UART, as but one very particular example. In one particular embodiment, BPF 1280 can be a two-pole filter with a center frequency of 1500 Hz and a bandwidth of 1570 Hz. An LPF 1282 can be a three-pole filter with a cutoff frequency of 1.1 kHz.

Figure 13:
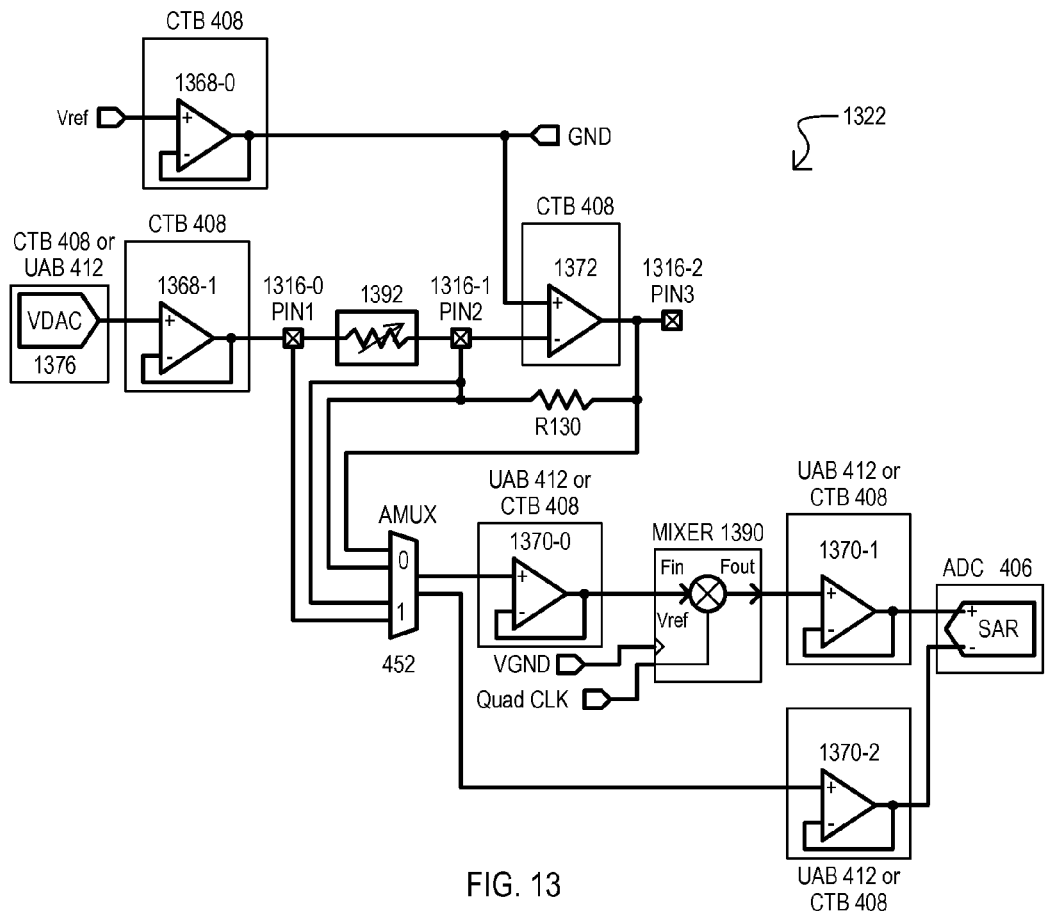
FIG. 13 is a schematic diagram of a glucose meter path that can be implemented in an IC device like that of FIG. 4.

FIG. 13 shows another signal path that can be implemented in an IC device 400 like that of FIG. 4. FIG. 13 shows a glucose meter application, which can determine a blood sugar level based on resistance of a test strip 1392. In the embodiment shown, signal path 1322 can be produced by configuring one or more CT Blocks 408, one or more UABs 412, an analog MUX 452, and one or more analog routing blocks 410. It is noted that particular routing through analog routing blocks 410 can vary according to implementation, so such routing is omitted. Such routing is understood by reference to FIG. 4. A signal path passing between particular blocks of an analog section 402 is understood to use one or more analog routing block 410 (e.g., a signal path going from a CT block 408 to a UAB 412).

One or more CT blocks 408 can be configured into buffers 1368-0/1 and amplifier 1372. A VDAC 1376 can implemented in either a CT block 408 or a UAB 412. One or more UABs 412 can be configured into mixer 1390 and buffers 1370-0 to -3. Alternatively, any of buffers 1370-0 to -3 can be implemented in a CT block 408.

In operation, a test strip 1392 can be connected between I/Os 1316-0 (PIN1) and 1316-1 (PIN2). Buffer 1368-0 can drive a first input (+) of amplifier 1372. VDAC 1376 can provide a programmable voltage to the input of buffer 1368-1, which drives PIN1. PIN2 can be connected to a (−) input of amplifier 1372. A feedback resistor R130 can be connected between the output of amplifier 1372 and its (−) input.

The output of amplifier 1372 (which is also PIN3 in the embodiment shown) and the voltage at PIN2 can be a first input set to analog MUX 452. The voltage at PIN2 and the output of VDAC 1376 (i.e., PIN1) can serve as a second input pair to analog MUX 452. Analog MUX 452 can selectively provide either input pair as an output pair.

A first signal from an analog MUX output pair can be buffered by buffer 1370-0 before being provided as an input to mixer 1390. Mixer 1390 can receive a quadrature clock (Quad CLK) as a mixing input signal. A resulting mixed signal can be buffered by buffer 1370-1 to provide a first input (+) to SAR ADC 406. The second signal of the analog MUX output pair can be buffered by buffer 1370-2 before provided as a second input (−) to SAR ADC 406.

Figure 14:
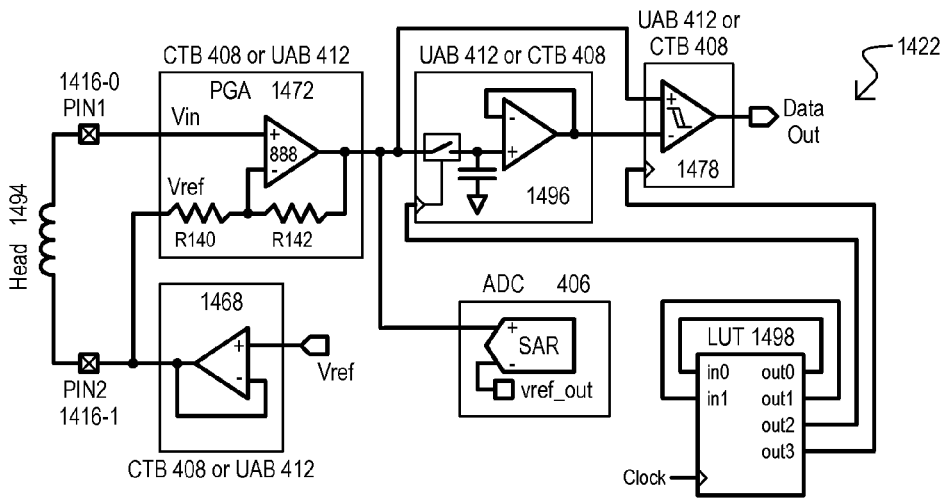
FIG. 14 is a schematic diagram of a magnetic card reader path that can be implemented in an IC device like that of FIG. 4.

FIG. 14 shows another signal path that can be implemented in an IC device 400 like that of FIG. 4. FIG. 14 shows a magnetic card reader which can read a value encoded into a magnetic strip. In the embodiment shown, signal path 1322 can be produced by configuring one or more CT Blocks 408 or UABs 412. It is noted that particular routing through analog routing blocks 410 can also be included, and can vary according to implementation, so such routing is omitted.

One or more CT blocks 408 can be configured into a PGA 1472 and buffer 1468. Alternatively, PGA 1472 and/or buffer 1468 could be realized in a UAB 412. One or more UABs 412 can be configured into a track and hold (track/hold) circuit 1496 and a comparator 1478. Alternatively, track/hold circuit 1486 and/or comparator 1478 could be realized in a CT block 408.

A signal path 1422 can further include a state machine (look up table (LUT)) 1498. In some embodiments a LUT 1498 can reside in a digital section (e.g., 404) of PASS 436. However, in other embodiments, a LUT 1498 could be present in a UAB 412 and/or CT Block 408.

In operation, a magnetic strip can be swiped across magnetic head 1494. Magnetic head 1494 can be connected between I/Os 1416-0 (PIN1) and 1416-1 (PIN2). PIN1 can be an input voltage to PGA 1472. Buffer 1468 can drive PIN2 with a reference voltage Vref. Reference voltage Vref is provided to PGA 1472. An output of PGA 1472 can be provided as an input to SAR ADC 406, track/hold circuit 1496 and a (+) input to comparator 1478.

Track/hold circuit 1496 can sample and hold an output of PGA 1472, and provide it as a (−) input to comparator 1478. Operations of track/hold circuit 1496 and comparator 1478 can be controlled according to outputs of LUT 1498. An output of comparator 1478 can provide the read data.

The various configurations describe herein are but a few of numerous possible configurations. A limited number of possible general signal paths for an IC device like that of FIG. 4 are shown in a table in FIG. 15. It is understood that this table is exemplary, and represents a small sample of possible configurations.

FIGS. 16A to 16C are diagrams showing an analog routing block that can be included in embodiments. FIG. 16A is a block diagram showing an analog routing block 1610 connected to a SAR MUX 1614, SAR ADC 1606 and PRB 1642. FIG. 16B shows the same arrangement, in a more detailed embodiment. FIG. 16C is as schematic diagram of a switch element that can be included in analog routing blocks of embodiments.

FIG. 16A shows how analog routing MUX 1610 can serve as a routing matrix to connect any of SAR MUX 1614, SAR ADC 1606 or PRB 1642 to one another.

FIG. 16B can be a particular implementation of the arrangement shown in FIG. 16A. FIG. 16B shows SAR MUX 1614', SAR ADC 1606' and PRB 1642' interconnected to analog routing block 1610'. Analog routing block 1610' can include various routing lines connected to SAR MUX 1614', six are shown as sarmux_coreio0 to sarmux_coreio3 and sarmux_vin+ and sarmux_vin−. In addition, other lines can be connected to SAR ADC 1606', three shown as a route, sar_v+ and sar_v−.

Analog routing block 1610' can further include various other lines which can extend to other blocks of a device. These are shown as ctb0_vout0/1, uab0_vout0/1, ctb1_vout0/1, uab1_vout0/1, ctb2_vout0/1, uab2_vout0/1, ctb3_vout0/1, uab3_vout0/1, and acore_u0 to acore_u5.

Referring still to FIG. 15B, the various lines can be connected to one another by switch elements shown as circles at the intersections of the lines. In the very particular embodiment shown, switch elements can include static elements, indicated by circles with no hatching (one shown as 1601), as well as two types of dynamic switches (one of each shown as 1603 and 1605). Dynamic switches (1603 and 1605) can be turned on or off while in operation to provide dynamic configuration of the analog routing block 1610'.

FIG. 16B also shows switches 1607 in series in the path between SAR MUX outputs sarmux_vin− and sarmux_vin+ and inputs to the SAR ADC 1606'. In some embodiments, these switches can have lower impedance than other switches of the analog routing block 1610'. In a particular embodiment, switches 1607 can be made larger by stacking two switches in parallel.

As shown in FIG. 16B, a SAR MUX 1614' can interface with a SAR ADC 1606' not directly, but via analog routing block 1610'. This can enable the insertion of various other analog blocks (e.g., CT blocks 408, UABs 412, PRB 442, or other analog routing blocks) between the SAR MUX 1614' and SAR ADC 1606'. For example, when performing a 4:1 multiplexing at the input of the SAR ADC 1606', a single CT block (e.g., 408) can be used as a front-end buffer for the SAR ADC 1606'. Also, a UAB (e.g., 412) can be used as anti-alias filter inserted between SAR MUX 1614' and SAR ADC 1606'. In the embodiment shown, lines "sarbus0/1" can be a pair of wires that expand reach of the SAR MUX 1614' to any of multiple CT blocks (408). Routing can work in conjunction with the SAR Sequencer that controls operations of the SAR ADC 1606'.

Referring to FIG. 16C, a switch element 1609, such as any of those shown as 1601, 1603, 1605 in FIG. 16B, can include a series connection of CMOS devices arranged in transmission gate configurations 1609-0/1 to enable a signal to pass between connections t1 and t2. A switch element 1609 can also include a grounding element 1611 which can pull an intermediate node to Vssa when the switch is off. In some particular embodiments, n-channel transistors within gates 1609-0/1 can be driven with a charge pump generated voltage that is higher than a high power supply voltage to reduce impedance through path when the switch element 1609 is turned on. In addition or alternatively, p-channel transistors within gates 1609-0/1 can be driven with a charge pump generated voltage that is lower than a low power supply voltage to reduce impedance through path when the switch element 1609 is turned on.

Figure 17:
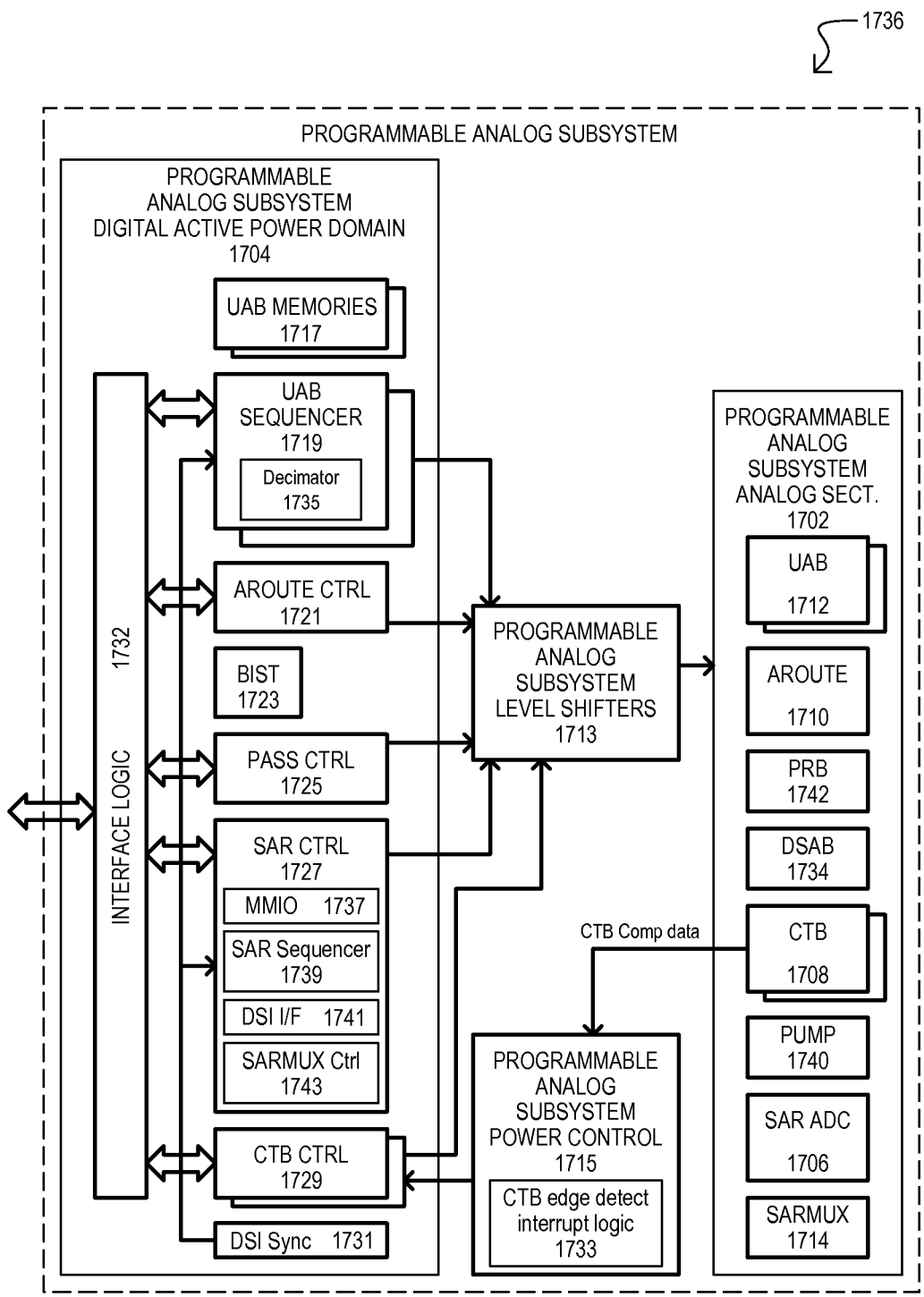
FIG. 17 is a block diagram of a programmable analog subsystem (PASS) according to an embodiment.

FIG. 17 is a block diagram of a PASS 1736 according to an embodiment. In a particular embodiment, a PASS 1736 can be one implementation of that shown in FIG. 4. A PASS 1736 can include an analog section 1702, a digital section 1704, level shifters 1713, and a power control section 1715.

An analog section 1702 can include UABs 1712, analog routing blocks 1710, PRB 1742, an amplifier bias circuit 1734, CT blocks 1708, a charge pump 1740, an SAR ADC 1706, and SAR MUX 1714. Such components can take the form of like components described for other embodiments herein, or equivalents.

Level shifters 1713 can provide appropriate shifting of signals between analog section 1702 and digital section 1704, as power supply levels can vary between the two. Power control section 1715 can place PASS 1736 circuit elements into various power modes of operation (e.g., ACTIVE, SLEEP, HIBERNATE). In the embodiment shown, power control section 1715 can include a CT block edge detect circuit 1733, which can enable the detection of activity in a CT block 1708 in a SLEEP mode.

A digital section 1704 can include memory mapped registers for controlling the operation of various blocks in the analog section 1702. A digital section 1704 can handle clock synchronization for signals from other clock domains. In a particular embodiment, digital section can provide for static control of the PRB 1742, CT blocks 1708, amplifier bias circuit 1734, SAR ADC 1706, analog routing blocks 1710, and UABs 1712 to ensure they are configured correctly. In addition, it can provide for dynamic control of the SAR MUX 1714, SAR ADC 1706, UAB clock waveforms, and CT blocks 1708.

Referring still to FIG. 17, a digital section can include UAB memories 1717, UAB sequencer logic 1719, analog route block control 1721, BIST circuits 1723, PASS control circuits 1725, SAR ADC control circuits 1727, CT block control circuits 1729, digital system interconnect (DSI) synchronization circuit 1731, and processor interface logic 1732. UAB memories 1717 can be memories for use by UABs 1712. In some embodiments, UAB memories 1717 can store clocking waveforms for various functions. In a particular embodiment, UAB memories can be static random access memories (SRAMs).

UAB sequencer logic 1719 can control the operation/ configuration of UABs 1712 to enable various functions. Such control can be according to memory mapped I/O (MMIO) registers. In some embodiments, UAB sequencer logic 1719 can enable the implementation of VDACs within UABs 1712. This can include control of a strobe function to change capacitor values on A and B branches in a switched capacitor type VDAC, as well as the ability to ground unused capacitors on a B branch. In addition or alternatively, UAB sequencer logic 1719 can support the implementation of sigma-delta type ADC within a UAB 1712. UAB sequencer logic 1719 can also support the control of decimator operations 1735, including dual decimators can be used separately or as a chained decimator. Such decimator control can include single and continuous sample modes and decimation ratios from 1-512. UAB sequencer logic 1719 can also generate interrupts upon completion of tasks. Such interrupts can be for a processor in the system, or transmitted via a digital system interconnect (DSI) which serve as a switch fabric for various digital circuits of an IC device that includes the PASS 1736. Still further, UAB sequencer logic 1719 can generate a reset for the UABs 1712 when it is determined they are in an idle state.

Analog route block control 1721 can control the operation/configuration of analog routing blocks 1710. Such control can be static, dynamic or a combination thereof. In some embodiments, such control can be by way of MMIO registers.

BIST circuits 1723 can enable self-testing of some or all portions of the PASS 1736.

PASS control circuits 1725 can control various blocks of the PASS 1736. In some embodiments, PASS control circuits 1724 can control PRB 1742, charge pump 1740 and amplifier bias circuit 1742. In some embodiments, such control can be by way of MMIO registers. PASS control circuits 1725 can provide various other additional functions. For example, it can configure a DSI interface including trigger for enabling synchronization, as well as a trigger selector for the SAR ADC 1706. According to embodiments, any of the analog blocks of the analog section 1702 can generate interrupts that are detected by other blocks of the PASS 1736. In some embodiments, PASS control circuits 1725 can contain interrupt cause registers for CT blocks 1708 and UABs 1712. Such interrupt cause registers can be combined to provide one consolidated CT block interrupt and one consolidated UAB interrupt. Interrupt cause registers can be used to determine an interrupt source.

SAR ADC control circuits 1727 can control operations of the SAR ADC 1706 and SAR MUX 1714. SAR ADC control circuits 1727 can include MMIO registers 1737, an SAR sequencer 1739, a DSI interface 1741, and a SAR MUX control section 1743. MMIO registers 1737 can be used to control the SAR ADC 1706 and SAR MUX 1714. In particular embodiments, SAR sequencer 1739 can operate an SAR ADC 1706 as a 12-bit ADC sampling at 1 Msps on 16 channels. SAR ADC control circuits 1727 can also include circuits to control post-processing of ADC conversion results. A DSI interface 1741 can enable SAR ADC control circuits 1727 to communicate with other digital circuits of an IC device, including generating interrupts. In addition, a DSI interface 1741 can enable data from the PASS 1736 to be passed on to other digital circuits (e.g., universal digital blocks (UDBs)) for further processing. Still further, a DSI interface 1741 can provide analog switch controls that are fully synchronized to operations of circuits within the analog section 1702 (e.g., synchronized to a sampling window of SAR ADC 1706). SAR MUX control section 1743 can control the operation of SAR MUX 1714. This can include static and/or dynamic control of multiplexing.

CT block control circuits 1729 can control operation/ configuration of CT blocks 1708. Such control can be by way of MMIO registers in some embodiments. In some embodiments, CT block control circuits 1729 can generate interrupts based on operations within the CT blocks.

Digital system interconnect synchronization circuit 1731 can synchronize communications of UAB sequencer logic 1719, and SAR ADC control circuits 1727 to enable such sections to communicate over a DSI bus.

Processor interface logic 1732 can provide an interface between digital section 1704 and other circuits of an IC device. In a particular embodiment, processor interface logic 1732 can include a 32-bit compatible AHB interface. In addition or alternatively, processor interface logic 1732 can include a DSI interface to enable communication with various other digital circuits including but not limited to: a central processing unit, reconfigurable logic circuits and memories.

According to embodiments, different analog circuit blocks can be synchronized to operate with one another. In some embodiments, an analog circuit block with switched capacitor circuits can be synchronized with another analog circuit block having a sampling window. In a particular embodiment, a reconfigurable discrete time analog circuit block can have an output synchronized with an SAR ADC.

Synchronization can take various forms including "scheduled" and/or "unscheduled" approaches. In a scheduled approach, timing of operations within corresponding blocks can be adjusted to ensure signals are valid when necessary. In an unscheduled approach, an output value from one block can be provided with a corresponding valid signal. An analog circuit block receiving the output signal can time its operations based on the valid signal.

Figure 18A:
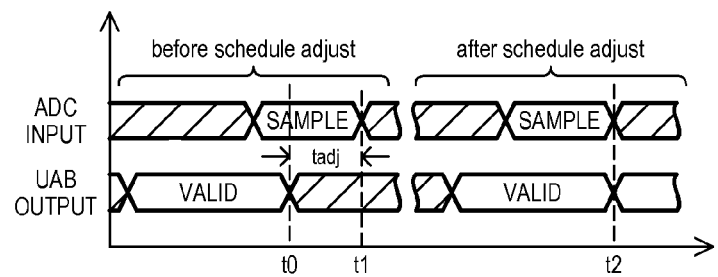
FIGS. 18A to 18C are diagrams showing how analog blocks of an IC device can be synchronized with one another, according to embodiments.

FIG. 18A is a timing diagram showing an example of analog block synchronization according to one particular embodiment. FIG. 18A shows a scheduled synchronization between a discrete time block UAB and an ADC. As shown, an ADC input can have a sampling window (SAMPLE). Before scheduling adjustments, the timing of the UAB results in an output (UAB OUTPUT) that is not valid throughout the sampling window. In particular, UAB OUTPUT ceases being valid at time t0, while the sampling window closes at time t1.

According to embodiments, the timing of a UAB can be adjusted to ensure UAB OUTPUT is valid during the ADC sampling window. FIG. 18A shows timing after a scheduling adjustment. In the particular embodiment shown, UAB OUTPUT timing has been shifted so that the end of the sampling window is aligned with the UAB OUTPUT valid time at time t2.

Figure 18B:
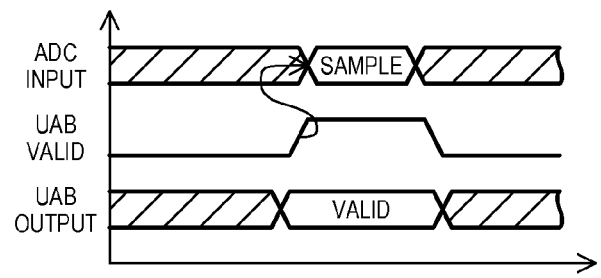

FIG. 18B is a timing diagram showing another example of analog block synchronization according to one another embodiment. FIG. 18B shows an unscheduled synchronization between a discrete time block UAB and an ADC. As shown, a UAB can provide a signal to be sampled (UAB OUTPUT) as well as a corresponding output valid signal (UAB VALID). According to embodiments, an ADC can base its sampling operation (SAMPLE) on the valid signal (UAB VALID). In the particular embodiment shown, ADC can start its sampling when UAB VALID transitions to an active value (high in this example).

Figure 18C:
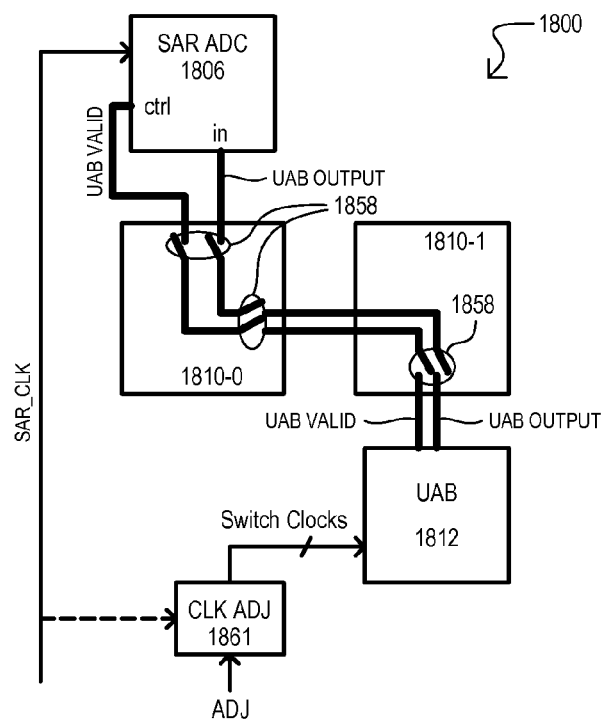

FIG. 18C is a block diagram showing one example of an IC device 1800 that can include scheduled or unscheduled synchronization. An IC device 1800 can include items like those of FIG. 4, including a fixed function analog circuit (SAR ADC 1806), analog routing blocks 1810-0/1, and a discrete time block (UAB 1812). In addition, IC device 1800 can include a clock adjust circuit 1861.

In a scheduled synchronization arrangement, UAB 1812 can operate according to switch clocks provided by clock adjust circuit 1861. For example, clocks (Switch Clocks) can control a switch capacitor network, and hence the time at which an output from UAB 1812 (UAB OUTPUT) is valid. In addition, a sampling window for SAR ADC can be controlled according to a clock SAR_CLK. In one embodiment, clock adjust circuit 1861 can alter Switch Clocks to ensure UAB OUTPUT is valid during a sampling window of SAR ADC. This can include any of: adjusting Switch Clocks, adjusting SAR_CLK, or adjusting both.

In an unscheduled synchronization arrangement, UAB 1812 can generate both an output value (UAB OUTPUT) as well as a valid signal (UAB VALID). UAB VALID can be timed to indicate when UAB OUTPUT is valid. According to embodiments, output signal UAB OUTPUT can be routed with the corresponding UAB VALID signal in similar routing paths, using the similar switches 1858 within analog routing blocks 1810-0/1.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit (IC) device, comprising:
   a plurality of input/outputs (I/Os) of the IC device;
   a plurality of analog blocks, wherein the plurality of analog blocks is different from the plurality of I/Os, the plurality of analog blocks including:
      a fixed function analog circuit; and
      a plurality of reconfigurable analog circuit blocks including a continuous time (CT) block comprising a plurality of reconfigurable analog circuits for executing signal processing in a continuous time domain and a discrete time (DT) block comprising reconfigurable analog circuits with a reconfigurable switch network;
   an analog multiplexer (MUX) configured to selectively connect any of the plurality of I/Os to the plurality of analog blocks, the analog MUX including at least one low noise signal path pair having a lower resistance than other signal paths of the analog MUX;
   a digital section comprising digital circuits;
   a processor interface coupled to the plurality of analog blocks; and
   a reconfigurable routing network configured to provide at least two different types of signal routing between any of the plurality of analog blocks, comprising a standard routing and at least one or more of a low resistance routing and a low noise routing,
   wherein the reconfigurable routing network is configured to provide at least one of:
      a buffered differential signal path to the fixed function analog circuit, wherein the reconfigurable analog routing network is configured to couple the CT block to the buffered differential signal path;
      a driven front-end differential signal path to the fixed function analog circuit, wherein the reconfigurable analog routing network is configured to couple the CT block and the DT block to the driven front-end differential signal path; and
      a filtered differential signal path to the fixed function analog circuit, wherein the reconfigurable analog routing network is configured to couple the CT block and a the DT block to the filtered differential signal path.

2. The IC device of claim 1, wherein:
the fixed function analog circuit includes an analog-to-digital converter (ADC) circuit.

3. The IC device of claim 2, wherein:
the ADC circuit comprises a successive-approximation register (SAR) type ADC.

4. The IC device of claim 1, further comprising:
synchronization circuits configurable to synchronize outputs of at least one of the plurality of analog blocks to an input of a receiving analog block comprising at least one of the plurality of analog blocks.

5. The IC device of claim 4, wherein:
the fixed-function analog circuit includes an analog-to-digital converter (ADC); and
the synchronization circuits are configurable to synchronize an output of at least one of the plurality of reconfigurable analog circuit blocks with a sampling window of the ADC.

6. The IC device of claim 4, wherein:
the synchronization circuits are selected from the group of:
   scheduled synchronization circuits configured to control a timing of the at least one of the plurality of analog blocks to output values that are synchronized with operations of the receiving analog block, and
   unscheduled synchronization circuits configured to output a valid signal with output values from the at least one of the plurality of analog blocks, and the receiving analog block times its operations according to the valid signal.

7. The IC device of claim 1, wherein:
the plurality of reconfigurable analog circuit blocks are dynamically reconfigurable.

8. The IC device of claim 1, wherein:
the digital section comprises reconfigurable digital circuits.

9. The IC device of claim 1, wherein:
the processor interface comprises a plurality of synchronous buses, including an address bus, a control signal bus, a read data bus, and a write data bus separate from the read data bus.

10. The IC device of claim 1, wherein the CT block is reconfigured during operation to provide buffering for the buffered differential signal path.

11. The IC device of claim 1, wherein the CT block is reconfigured during operation to provide unity gain for the driven front-end differential signal path.

12. The IC device of claim 1, wherein the CT block is reconfigured during operation to provide filtering for the filtered differential signal path.

13. The IC device of claim 1, wherein the DT block is reconfigured to provide amplification for the filtered differential signal path.

14. The IC device of claim 1, wherein the processor interface is may be compatible with the Advanced High-Performance Bus (AHB).

15. An integrated circuit (IC) device, comprising:
a plurality of analog blocks, including
   at least one reconfigurable analog circuit block comprising a plurality of analog circuit resources reconfigurable to enable some of the analog circuit resources for use as a buffer in one configuration and other of the analog resources for use as a unity gain amplifier in another configuration;
an analog multiplexer (MUX) configured to selectively connect any of a plurality of input/outputs (I/Os) of the IC device to the plurality of analog blocks, wherein the plurality of analog blocks is different from the plurality of I/Os;
a digital section comprising digital circuits;
a reconfigurable routing network configured to provide at least two different types of signal routing between any of the plurality of analog blocks, the signal routing comprising a standard routing and at least one or more of a low resistance routing and a low noise routing; and
a processor interface coupled to the plurality of analog blocks.

16. The IC device of claim 15, wherein:
the at least one reconfigurable analog circuit block comprises a plurality of operational amplifier circuits.

17. The IC device of claim 15, wherein:
the plurality of analog blocks includes at least one block selected from:
   a continuous time block comprising a plurality of reconfigurable operational amplifier circuits, and
   a discrete time block comprising amplifiers with a reconfigurable switch network.

18. The IC device of claim 15, wherein:
the digital section comprises reconfigurable digital circuits.

19. The IC device of claim 15, wherein:
at least one reconfigurable analog circuit block is dynamically reconfigurable.

20. The IC device of claim 15, wherein:
the at least one reconfigurable analog circuit block and the reconfigurable routing network are configured in response to signals generated from either the digital section or the processor interface, or both.

21. A method, comprising:
generating digital signals with a digital section of an integrated circuit (IC) device that includes digital circuits;
configuring at least one analog block of a plurality of analog blocks into a first signal processing signal path in response to the digital signals, the plurality of analog blocks and the first signal processing path being formed in the IC device, the plurality of analog blocks including
   a fixed function analog circuit; and
   a plurality of reconfigurable analog circuit blocks including a continuous time (CT) block comprising a plurality of reconfigurable analog circuits for executing signal processing in a continuous time domain and a discrete time (DT) block comprising a plurality of reconfigurable analog circuits with a reconfigurable switch network;
configuring an analog multiplexer (MUX) to selectively connect any of a plurality of input/outputs (I/Os) of the IC device to the plurality of analog blocks, wherein the plurality of analog blocks is different from the plurality of I/Os; and
reconfiguring a reconfigurable routing network to provide at least two different types of signal routing between any of the plurality of analog blocks, the signal routing comprising a standard routing and at least one or more of a low resistance routing and a low noise routing;
wherein reconfiguring the reconfigurable routing network comprises at least one of:
   configuring a buffered differential signal path to the fixed function analog circuit, wherein the reconfigurable analog routing network is configured to couple the CT block to the buffered differential signal path;

configuring a driven front-end differential signal path to the fixed function analog circuit, wherein the reconfigurable analog routing network is configured to couple the CT block and the DT block to the driven front-end differential signal path; and configuring a filtered differential signal path to the fixed function analog circuit, wherein the reconfigurable analog routing network is configured to couple the CT block and a the DT block to the filtered differential signal path.

22. The method of claim 21, further including:

reconfiguring the at least the one analog block into a second signal processing signal path, the second signal processing path being formed in the IC device and using different analog circuit resources of the at least one analog block than the first signal processing path.

23. The method of claim 22, further including:

dynamically reconfiguring the at least the one analog block into the second signal processing path.

24. The method of claim 21, wherein:

at least a portion of the digital signals are received at a processor interface of the IC device.

25. The method of claim 21, wherein:

reconfiguring the reconfigurable routing network includes configuring at least two of the plurality of analog blocks and interconnecting the at least two of the analog blocks to one another.

* * * * *